US009103030B2

(12) United States Patent
Kato et al.

(10) Patent No.: US 9,103,030 B2
(45) Date of Patent: Aug. 11, 2015

(54) FILM DEPOSITION APPARATUS

(75) Inventors: Hitoshi Kato, Oshu (JP); Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1181 days.

(21) Appl. No.: 12/627,144

(22) Filed: Nov. 30, 2009

(65) Prior Publication Data

US 2010/0132615 A1  Jun. 3, 2010

(30) Foreign Application Priority Data

Dec. 2, 2008 (JP) .................................. 2008-307825

(51) Int. Cl.
C23C 16/00 (2006.01)
C23C 16/455 (2006.01)
C23C 16/44 (2006.01)
C23C 16/40 (2006.01)

(52) U.S. Cl.
CPC ......... C23C 16/45551 (2013.01); C23C 16/402 (2013.01); C23C 16/4412 (2013.01); C23C 16/45578 (2013.01)

(58) Field of Classification Search
CPC ............... C23C 16/45551; C23C 16/4412; C23C 16/45578; C23C 16/402; H01L 21/67109; H01J 37/32449
USPC .............. 118/719, 733, 725; 156/345.33
See application file for complete search history.

(56) References Cited

U.S. PATENT DOCUMENTS

| 5,062,386 | A  | * | 11/1991 | Christensen    | 118/725 |
|-----------|----|---|---------|----------------|---------|
| 6,634,314 | B2 |   | 10/2003 | Hwang et al.   |         |
| 7,033,444 | B1 | * | 4/2006  | Komino et al.  | 118/725 |
| 7,153,542 | B2 |   | 12/2006 | Nguyen et al.  |         |
| 2006/0073276 | A1 | * | 4/2006 | Antonissen   | 427/248.1 |
| 2007/0095289 | A1 | * | 5/2007 | Arami        | 118/725 |
| 2007/0215036 | A1 | * | 9/2007 | Park et al.  | 117/88 |
| 2007/0218701 | A1 |   | 9/2007 | Shimizu et al. |       |
| 2007/0218702 | A1 |   | 9/2007 | Shimizu et al. |       |

FOREIGN PATENT DOCUMENTS

| JP | 04010528 A | * | 1/1992 |
| JP | 04-287912 |   | 10/1992 |
| JP | 3144664 |   | 3/2001 |
| JP | 2001-254181 |   | 9/2001 |
| JP | 2004-343017 |   | 12/2004 |
| JP | 2007-247066 |   | 9/2007 |

* cited by examiner

Primary Examiner — Rakesh Dhingra
Assistant Examiner — Charlee Bennett
(74) Attorney, Agent, or Firm — IPUSA, PLLC

(57) ABSTRACT

In a film deposition apparatus, a first separation gas is discharged from a separation gas supplying portion to a separation area between a first process area to which a first reaction gas is supplied and a second process area to which a second reaction gas is supplied. A heater is provided to heat the turntable by radiation heat. An outer sidewall member is provided in a bottom part of a vacuum chamber to surround the turntable in an area where the heater is provided. A space forming member is provided between the separation areas adjacent to each other in a rotating direction of the turntable and extending from the outer sidewall member to form a narrow space between the turntable. A purge gas flows from a lower side of the turntable to an area outside the turntable in a radial direction through the narrow space.

12 Claims, 26 Drawing Sheets

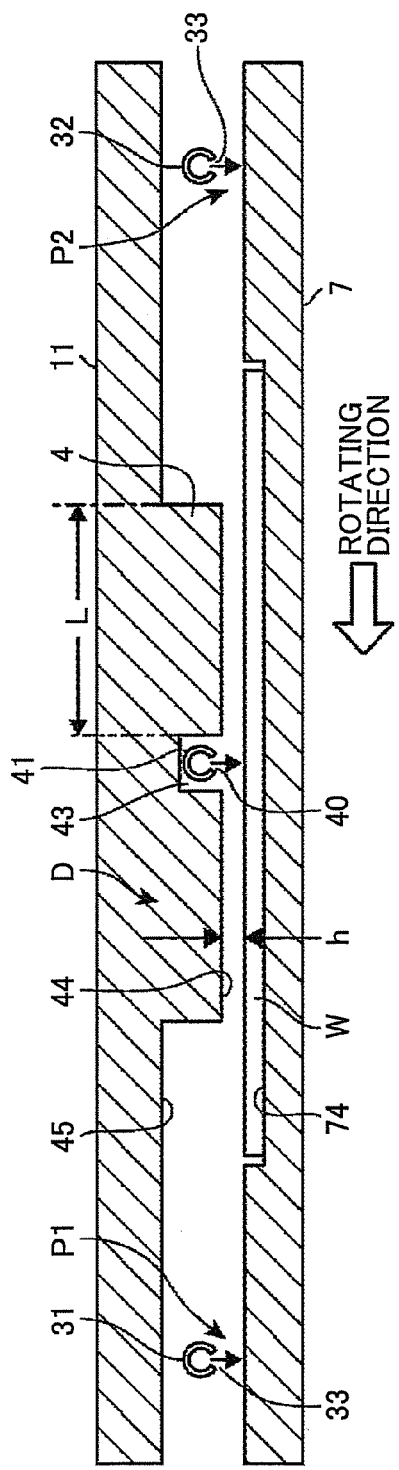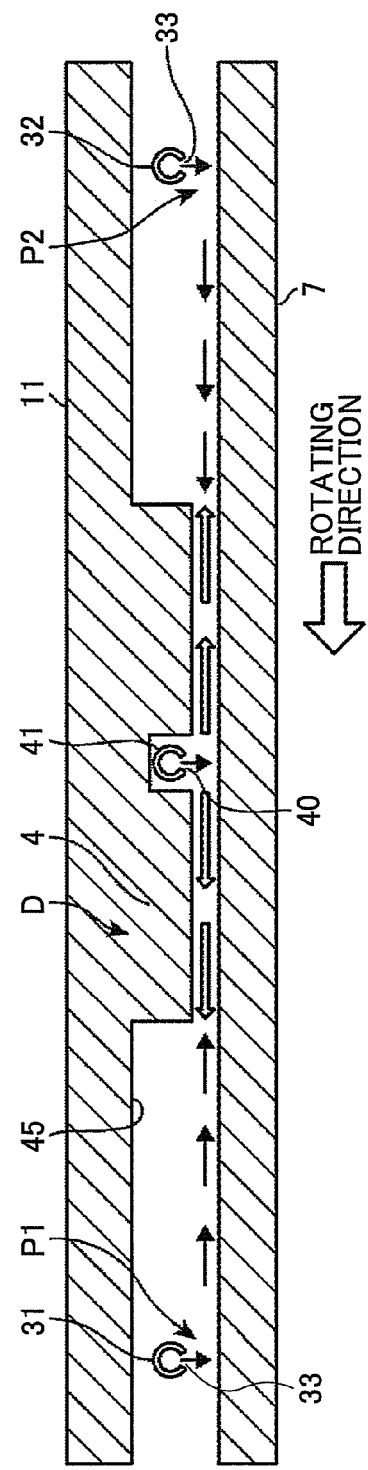
FIG.4A
FIG.4B

US 9,103,030 B2

FILM DEPOSITION APPARATUS

CROSS-REFERENCE TO RELATED APPLICATIONS

This application is based upon and claims the benefit of priority of the prior Japanese Patent Application No. 2008-307825, filed on Dec. 2, 2008, the entire contents of which are incorporated herein by reference.

FIELD OF THE INVENTION

The present invention relates to a film deposition apparatus, a substrate processing apparatus and a film deposition method, which forms a thin film in which a reaction product is laminated, by repeatedly performing a cycle to sequentially supply two kinds of reaction gases, which react with each other, onto a surface of a substrate, and a storage medium storing a program for performing the film deposition method.

BACKGROUND ART

As a film deposition technique in a semiconductor fabrication process, there has been known a so-called Atomic Layer Deposition (ALD) or Molecular Layer Deposition (MLD). In such a film deposition technique, a first reaction gas is adsorbed on a surface of a semiconductor wafer (referred to as a wafer hereinafter) under vacuum and then a second reaction gas is adsorbed on the surface of the wafer in order to form one or more atomic or molecular layers through reaction of the first and the second reaction gases on the surface of the wafer; and such an alternating adsorption of the gases is repeated plural times, thereby depositing a film on the wafer. This technique is advantageous in that the film thickness can be controlled at higher accuracy by the number of times alternately supplying the gases, and in that the deposited film can have excellent uniformity over the wafer. Therefore, this deposition method is thought to be promising as a film deposition technique that can address further miniaturization of semiconductor devices.

Such a film deposition method may be preferably used, for example, for depositing a dielectric material to be used as a gate insulator. When silicon dioxide ($SiO_2$) is deposited as the gate insulator, a bis (tertiary-butylamino) silane (BTBAS) gas or the like is used as a first reaction gas (source gas) and ozone gas or the like is used as a second gas (oxidation gas).

In order to carry out such a deposition method, use of a single-wafer deposition apparatus having a vacuum chamber and a shower head at a top center portion of the vacuum chamber has been under consideration. In such a deposition apparatus, the reaction gases are introduced into the chamber from the top center portion, and unreacted gases and by-products are evacuated from a bottom portion of the chamber. When such a deposition chamber is used, it takes a long time for a purge gas to purge the reaction gases, resulting in an extremely long process time because the number of cycles may reach several hundred. Therefore, a deposition method and apparatus that enable high throughput is desired.

Under these circumstances, film deposition apparatuses having a vacuum chamber and a turntable that holds plural wafers along a rotation direction have been proposed.

Patent Document 1 listed below discloses a deposition apparatus whose process chamber is shaped into a flattened cylinder. The process chamber is divided into two half-circle areas. Each area has an evacuation port provided to surround the area at the top portion of the corresponding area. In addition, the process chamber has a gas inlet port that introduces separation gas between the two areas along a diameter of the process chamber. With these configurations, while different reaction gases are supplied into the corresponding areas and evacuated from above by the corresponding evacuation ports, a turntable is rotated so that the wafers placed on the turntable can alternately pass through the two areas. A separation area to which the separation gas is supplied has a lower ceiling than the areas to which the reaction gases are supplied.

Patent Document 2 discloses a process chamber having a wafer support member (turntable) that holds plural wafers and that is horizontally rotatable, first and second gas ejection nozzles that are located at equal angular intervals along the rotation direction of the wafer support member and oppose the wafer support member, and purge nozzles that are located between the first and the second gas ejection nozzles. The gas ejection nozzles extend in a radial direction of the wafer support member. A top surface of the wafers is higher than a top surface of the wafer supporting member, and the distance between the ejection nozzles and the wafers on the wafer support member is about 0.1 mm or more. A vacuum evacuation apparatus is connected to a portion between the outer edge of the wafer support member and the inner wall of the process chamber. According to a process chamber so configured, the purge gas nozzles discharge purge gases to create a gas curtain, thereby preventing the first reaction gas and the second reaction gas from being mixed.

Patent Document 3 discloses a process chamber that is divided into plural process areas along the circumferential direction by plural partitions. Below the partitions, a circular rotatable susceptor on which plural wafers are placed is provided leaving a slight gap in relation to the partitions. In addition, at least one of the process areas serves as an evacuation chamber.

Patent Document 4 discloses a process chamber having four sector-shaped gas supplying plates each of which has a vertex angle of 45 degrees, the four gas supplying plates being located at angular intervals of 90 degrees, evacuation ports that evacuate the process chamber and are located between the adjacent two gas supplying plates, and a susceptor that holds plural wafers and is provided in order to oppose the gas supplying plate. The four gas supplying plates can discharge $AsH_3$ gas, $H_2$ gas, trimethyl gallium (TMG) gas, and $H_2$ gas, respectively.

Patent Document 5 discloses a process chamber having a circular plate that is divided into four quarters by partition walls and has four susceptors respectively provided in the four quarters, four injector pipes connected into a cross shape, and two evacuation ports located near the corresponding susceptors. In this process chamber, four wafers are mounted in the corresponding four susceptors, and the four injector pipes rotate around the center of the cross shape above the circular plate while ejecting a source gas, a purge gas, a reaction gas, and another purge gas, respectively. An injector unit is rotated horizontally and vacuum exhaust is performed from a periphery of a turntable so that injector pipes are positioned sequentially in the four placement areas.

Furthermore, Patent Document 6 (Patent Documents 7, 8) discloses a film deposition apparatus preferably used for an Atomic Layer CVD method that causes plural gases to be alternately adsorbed on a target (a wafer). In the apparatus, a susceptor that holds the wafer is rotated, while source gases and purge gases are supplied to the susceptor from above. Paragraphs 0023, 0024, and 0025 of the document describe partition walls that extend in a radial direction from a center of a chamber, and gas ejection holes that are formed in a bottom of the partition walls in order to supply the source gases or the purge gas to the susceptor, so that an inert gas as the purge gas ejected from the gas ejection holes produces a gas curtain. Regarding evacuation of the gases, paragraph 0058 of the document describes that the source gases are evacuated through an evacuation channel 30a, and the purge gases are evacuated through an evacuation channel 30b.

Patent Document 9 discloses a plasma processing apparatus having heating means 94 provided on outer circumference of a process chamber 32.

Patent Document 1: U.S. Pat. Publication No. 7,153,542: FIGS. 6A, 6B

Patent Document 2: Japanese Patent Application Laid-Open Publication No. 2001-254181: FIGS. 1 and 2

Patent Document 3: Japanese Patent Publication No. 3,144,664: FIG. 1, FIG. 2, claim 1

Patent Document 4: Japanese Patent Application Laid-Open Publication No. H4-287912

Patent Document 5: U.S. Pat. Publication No. 6,634,314

Patent Document 6: Japanese Patent Application Laid-Open Publication No. 2007-247066: paragraphs 0023 through 0025, 0058, FIG. 12 and FIG. 18

Patent Document 7: U.S. Pat. Publication No. 2007-218701

Patent Document 8: U.S. Pat. Publication No. 2007-218702

Patent Document 9: Japanese Laid-Open patent Application No. 2004-343017: paragraphs 0021 through 0025, FIG. 1 through FIG. 4

However, in the apparatus disclosed in Patent Document 1, because the reaction gases and the separation gas are supplied downward and then evacuated upward from the evacuation ports provided at the upper portion of the chamber, particles in the chamber may be blown upward by the upward flow of the gases and fall on the wafers, leading to contamination of the wafers.

In the technique disclosed in Patent Document 2, the gas curtain cannot completely prevent mixture of the reaction gases but may allow one of the reaction gases to flow through the gas curtain to be mixed with the other reaction gas partly because the gases flow along the rotation direction due to the rotation of the wafer support member. In addition, the first (second) reaction gas discharged from the first (second) gas outlet nozzle may flow through the center portion of the wafer support member to meet the second (first) gas, because centrifugal force is not strongly applied to the gases in a vicinity of the center of the rotating wafer support member. Once the reaction gases are mixed in the chamber, an MLD (or ALD) mode film deposition cannot be carried out as expected.

In the apparatus disclosed in Patent Document 3, in a process chamber, process gas introduced into one of the process areas may diffuse into the adjacent process area through the gap below the partition, and be mixed with another process gas introduced into the adjacent process area. Moreover, the process gases may be mixed in the evacuation chamber, so that the wafer is exposed to the two process gases at the same time. Therefore, ALD (or MLD) mode deposition cannot be carried out in a proper manner by this process chamber.

The disclosure of Patent Document 4 does not provide any realistic measures to prevent two source gases ($AsH_3$, TMG) from being mixed. Because of the lack of such measures, the two source gases may be mixed around the center of the susceptor and through the $H_2$ gas supplying plates. Moreover, because the evacuation ports are located between the adjacent two gas supplying plates to evacuate the gases upward, particles are blown upward from the susceptor surface, which leads to wafer contamination.

In the process chamber disclosed in Patent Document 5, after one of the injector pipes passes over one of the quarters, this quarter cannot be purged by the purge gas in a short period of time. In addition, the reaction gas in one of the quarters can easily flow into an adjacent quarter. Therefore, it is difficult to perform an MLD (or ALD) mode film deposition.

According to the technique disclosed in Patent Document 6, source gases can flow into a purge gas compartment from source gas compartments located in both sides of the purge gas compartment and be mixed with each other in the purge gas compartment. As a result, a reaction product is generated in the purge gas compartment, which may cause particles to fall onto the wafer.

When performing a film deposition method in the film deposition apparatus disclosed in Patent Documents 1 through 5, because a rotation table or turntable has a large diameter to permit a plurality of wafers such as, for example, four to six sheets, placed thereon in circular arrangement, an inertial force (hereinafter, referred to as inertia) of the turntable is large. Thus, if a method of driving the turntable by a stepping motor via a belt drive, which is a turntable driving method usually used in a film deposition apparatus in which a film deposition is carried out in a vacuum chamber, the turntable slips relative to the motor during acceleration and deceleration, which results in an angular displacement of an actual rotational angle with respect to a rotational angle instructed to the motor. Hereinafter, such an angular displacement in a rotational angle is referred to as a loss of synchronism. Although a motor for driving the turntable and a power transmission method are not disclosed in Patent Documents 1 through 5, in a method of driving a turntable by a stepping motor via a belt drive, which method is generally used in a film deposition apparatus using a vacuum chamber, because the inertia of the turntable is large, a slip (displacement) in rotational angles is generated between the turntable and a motor shaft due to a slip or a stretch of the belt at a time of start or at a time stop, which results in a loss of synchronism. As a result, when carrying a substrate into or out of a vacuum chamber, there may occur a problem in that the substrate cannot be placed on the turntable with good positional accuracy or the substrate cannot be taken out of the turntable surely.

With the technique disclosed in Patent Document 9, because the substrate placement area is normally formed larger than the substrate such as a wafer, the substrate such as a wafer moves in the substrate placement area due to a centrifugal force when the susceptor is rotated, and the substrate may be damaged due to a contact of the substrate with a wall surface of the substrate placement area.

SUMMARY OF THE INVENTION

It is a general object of the present invention to provide a novel, improved and useful film deposition apparatus in which the above-mentioned problems are eliminated.

A more specific object of the present invention is to provide a film deposition apparatus, which can provide a high throughput and perform a good process by preventing a plurality of reaction gases from being mixed on a substrate when forming a thin film by stacking many layers of a reaction product by sequentially supplying a the plurality of reaction gases, which react with each other, to a surface of the substrate.

In order to achieve the above-mentioned object, there is provided according to one aspect of the present invention a film deposition apparatus for depositing a film on a substrate by carrying out a cycle of alternately supplying at least two kinds of reaction gases that react with each other to the substrate to produce a layer of a reaction product in a vacuum chamber, the film deposition apparatus comprising: a turntable rotatably provided in the vacuum chamber; a substrate placement part provided in one surface of the turntable and configured to place the substrate thereon; a first reaction gas supplying portion configured to supply a first reaction gas to the one surface; a second reaction gas supplying portion configured to supply a second reaction gas to the one surface, the second reaction gas supplying portion being separated from the first reaction gas supplying portion along a rotation direction of the turntable; a separation area located along the rotation direction between a first process area to which the first reaction gas is supplied and a second process area to which the second reaction gas is supplied, the separation area separating the first process area and the second process area from each other; a heater provided on a lower side of the turntable to heat the turntable by radiation heat; an outer sidewall member provided in a bottom part of the vacuum chamber to surround an outer side of the turntable in a radial direction in an area where the heater is provided; a space forming member provided between the separation areas adjacent to each other in a rotating direction of the turntable and extending from the outer sidewall member to form a first narrow space between the space forming member and said turntable; and a first purge gas supplying portion configured to supply a purge gas flowing from the lower side of the turntable to an area outside the turntable in a radial direction through the first narrow space.

According to the present invention, even if the reaction gases supplied to the process area enters the space in the bottom part of the vacuum chamber through a gap between the turntable and the vacuum chamber, the reaction gases hardly enter the space, in which the heater is provided, against the flow of the purge gas. As a result, adhesion of a reaction product to the heater surface is suppressed, which allows elongation of an interval of maintenance and generation of particles in the vacuum chamber can be suppressed.

BRIEF DESCRIPTION OF THE DRAWINGS

FIGS. 4A and 4B are vertical cross-sectional views of a separation area in the film deposition apparatus;

DETAILED DESCRIPTION OF THE PREFERRED EMBODIMENTS

A description will now be given, with reference to the drawings, of embodiments of the present invention.

Figure 1:
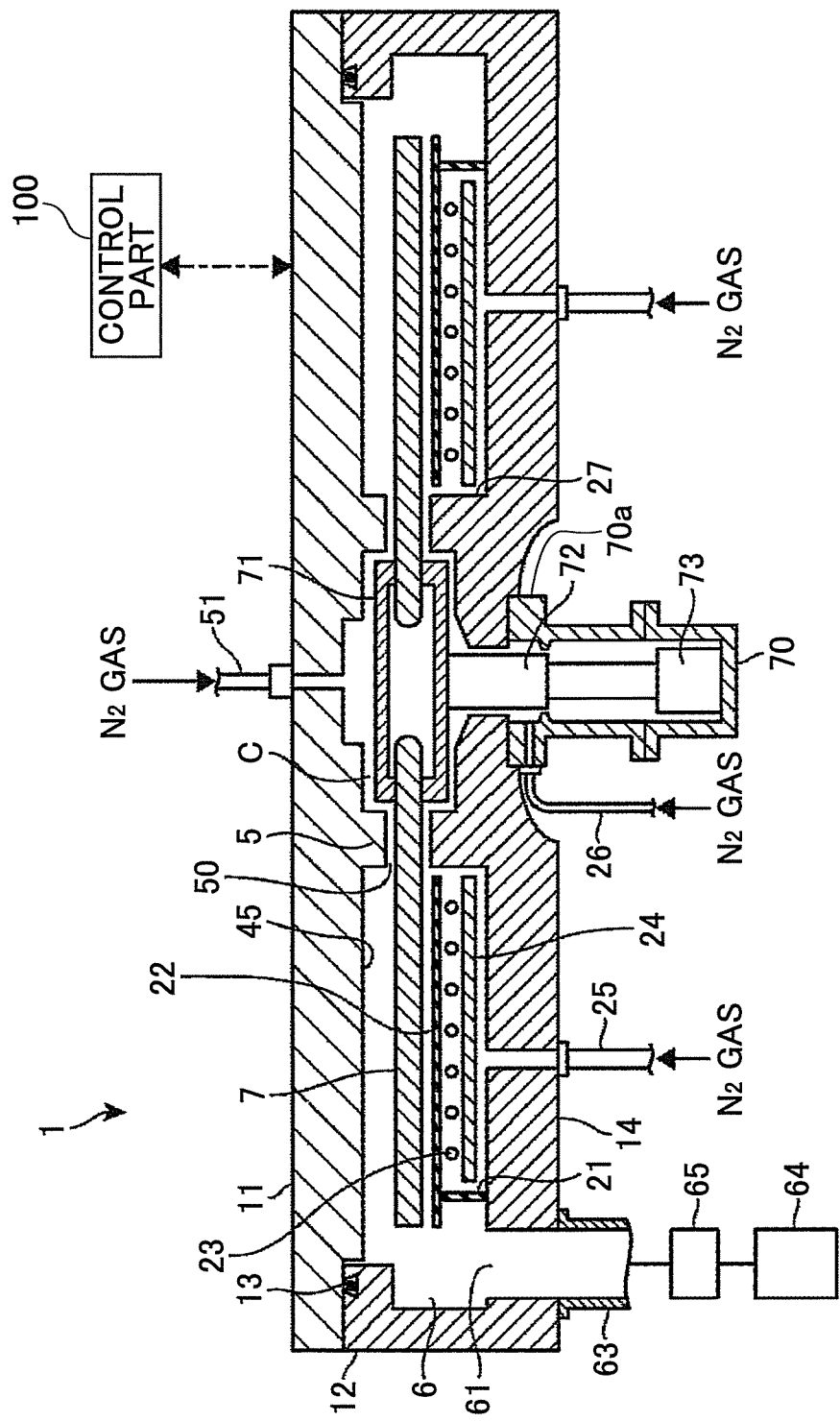
FIG. 1 is a vertical cross-sectional view of a film deposition apparatus according to an embodiment of the present invention.

As illustrated in FIG. 1 (a cross-sectional view taken along a I-I line of FIG. 3), a film deposition apparatus according to an embodiment of the present invention has a vacuum chamber 1 having a flattened cylinder shape, and a turntable 7 that is located inside the chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a ceiling member such as an O ring 13, so that the vacuum chamber 1 is hermetically sealed. On the other hand, the ceiling plate 11 can be raised by a driving mechanism (not shown) when the ceiling plate 11 has to be removed from the chamber body 12.

The turntable 7 is rotatably fixed onto a cylindrically shaped core portion 71. The core portion 71 is fixed on a top end of a rotation shaft 72 that extends in a vertical direction. The rotation shaft 72 penetrates a bottom portion 14 of the chamber body 12 and is fixed at the lower end to a driving part 73 that can rotate the rotation shaft 72 clockwise, in this embodiment. The rotation shaft 72 and the driving part 73 are housed in a case body 70 having a cylinder with a bottom. The case body 70 is hermetically fixed to a bottom surface of the bottom portion 14 via a flange part 70a, which isolates an inner environment of the case body 70 from an outer environment.

Figure 2:
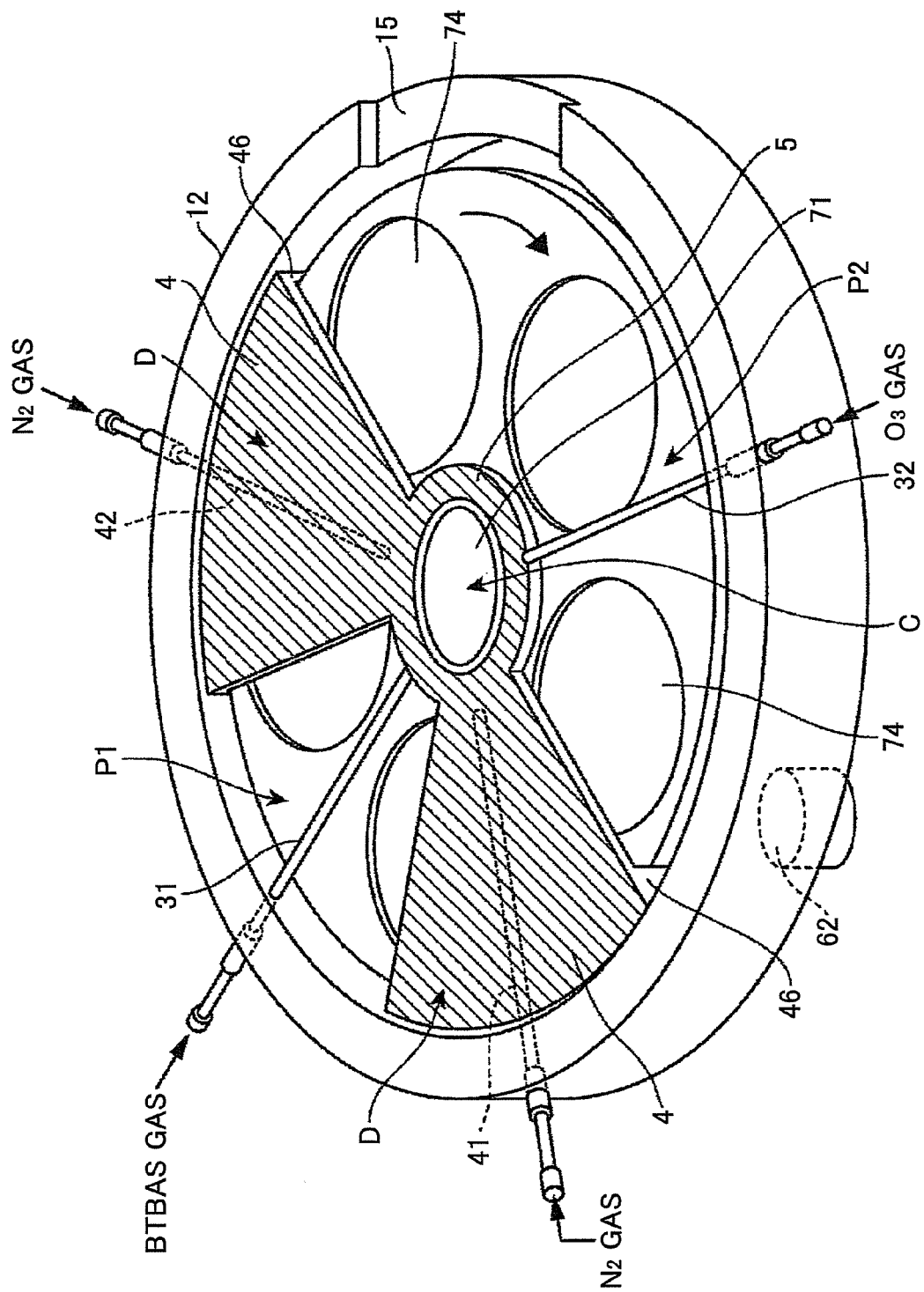
FIG. 2 is a perspective view illustrating an outline structure of an interior of the film deposition apparatus.
Figure 3:
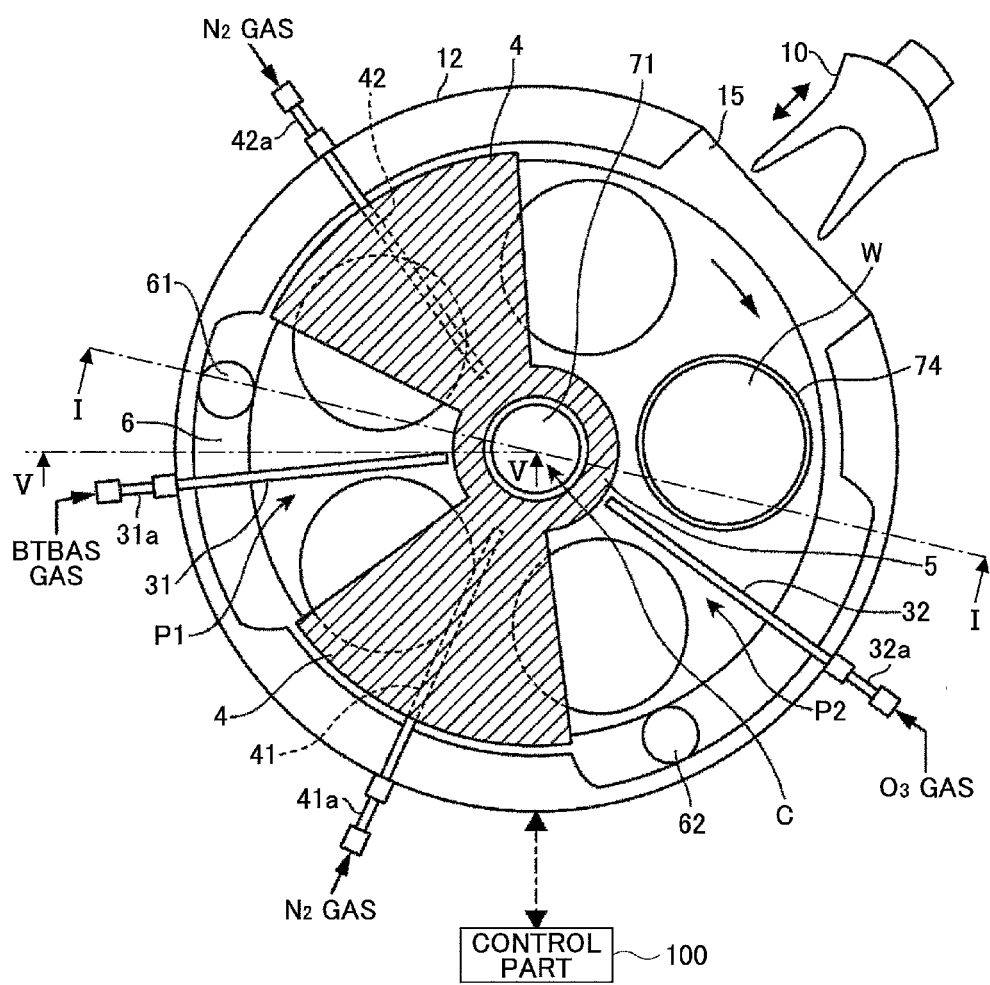
FIG. 3 is a horizontal plan view of the film deposition apparatus.

As illustrated in FIGS. 2 and 3, plural (five in the illustrated example) circular concave portions 74, each of which receives a wafer W, are formed in a top surface of the turntable 7, although only one wafer W is illustrated in FIG. 3. The concave portions 74 are located at equal angular intervals in the turntable 7. FIG. 4A is a projected cross-sectional diagram taken along an arc extending from a first reaction gas nozzle 31 to a second reaction gas nozzle 32 in FIG. 3. As shown in FIG. 4A, the concave portion 74 has a diameter slightly larger, for example, by 4 mm than the diameter of the wafer W and a depth equal to a thickness of the wafer W. Therefore, when the wafer W is placed in the concave portion 74, a surface of the wafer W is at the same elevation of a surface of an area of the turntable 7, the area excluding the concave portions 74. If there is a relatively large step between the area and the wafer W, gas flow turbulence is caused by the step, which may affect thickness uniformity across the wafer W. This is why the two surfaces are at the same elevation. While "the same elevation" may mean here that a height difference is less than or equal to about 5 mm, the difference has to be as close to zero as possible to the extent allowed by machining accuracy. In the bottom of the concave portion 74 there are formed three through holes (not shown) through which three corresponding elevation pins 16 (see FIG. 10) are raised/lowered. The elevation pins 16 support a back surface of the wafer W and raises/lowers the wafer W.

The concave portions 74 are wafer W receiving areas provided to position the wafers W and prevent the wafers W from being thrown out by centrifugal force caused by rotation of the turntable 7. However, the wafer W receiving areas are not limited to the concave portions 74, but may be performed by guide members that are located at predetermined angular intervals on the turntable 7 to hold the edges of the wafers W. For example, the wafer W receiving areas may be performed by electrostatic chucks. In this case, an area where the wafer W is placed corresponds to a substrate placement part Referring again to FIGS. 2 and 3, the chamber 1 includes a first reaction gas nozzle 31, a second reaction gas nozzle 32, and separation gas nozzles 41, 42 above the turntable 7, all of which extend in radial directions and at predetermined angular intervals. With this configuration, the concave portions 74 can move through and below the nozzles 31, 32, 41, and 42. In the illustrated example, the second reaction gas nozzle 32, the separation gas nozzle 41, the first reaction gas nozzle 31, and the separation gas nozzle 42 are arranged clockwise in this order. These gas nozzles 31, 32, 41, and 42 penetrate the circumferential wall portion of the chamber body 12 and are supported by attaching their base ends, which are gas inlet ports 31a, 32a, 41a, 42a, respectively, on the outer circumference of the wall portion. Although the gas nozzles 31, 32, 41, 42 are introduced into the chamber 1 from the circumferential wall portion of the chamber 1 in the illustrated example, these nozzles 31, 32, 41, 42 may be introduced from a ring-shaped protrusion portion 5 (described later). In this case, an L-shaped conduit may be provided in order to be open on the outer circumferential surface of the protrusion portion 5 and on the outer top surface of the ceiling plate 11. With such an L-shaped conduit, the nozzle 31 (32, 41, 42) can be connected to one opening of the L-shaped conduit inside the chamber 1 and the gas inlet port 31a (32a, 41a, 42a) can be connected to the other opening of the L-shaped conduit outside the vacuum chamber 1.

Although not illustrated in the figures, the reaction gas nozzle 31 is connected to a gas supplying source of bis (tertiary-butylamino) silane (BTBAS), which is a first source gas, and the reaction gas nozzle 32 is connected to a gas supplying source of $O_3$ (ozone) gas, which is a second source gas.

The reaction gas nozzles 31, 32 have plural ejection holes 33 to eject the corresponding source gases downward. The plural ejection holes 33 are arranged in longitudinal directions of the reaction gas nozzles 31, 32 at predetermined intervals. The ejection holes 33 have an inner diameter of about 0.5 mm, and are arranged at intervals of about 10 mm in this embodiment. The reaction gas nozzles 31, 32 are a first reaction gas supplying portion and a second reaction gas supplying portion, respectively, in this embodiment. In addition, an area below the reaction gas nozzle 31 is a first process area P1 in which the BTBAS gas is adsorbed on the wafer W, and an area below the reaction gas nozzle 32 is a second process area P2 in which the $O_3$ gas is adsorbed on the wafer W.

On the other hand, the separation gas nozzles 41, 42 are connected to gas supplying sources of $N_2$ (nitrogen) gas (not shown). The separation gas nozzles 41, 42 have plural ejection holes 40 to eject the separation gases downward from the plural ejection holes 40. The plural ejection holes 40 are arranged at predetermined intervals in longitudinal directions of the separation gas nozzles 41, 42. The ejection holes 40 have an inner diameter of about 0.5 mm, and are arranged at intervals of about 10 mm in this embodiment.

The separation gas nozzles 41, 42 are provided in separation areas D that are configured to separate the first process area P1 and the second process area P2. In each of the separation areas D, there is provided a convex portion 4 on the ceiling plate 11, as shown in FIGS. 2 through 4. The convex portion 4 has a top view shape of a sector whose apex lies at the center of the vacuum chamber 1 and whose arced periphery lies near and along the inner circumferential wall of the chamber body 12. In addition, the convex portion 4 has a groove portion 43 that extends in the radial direction as if the groove portion 43 substantially bisected the convex portion 4. The separation gas nozzle 41 (42) is located in the groove portion 43. A circumferential distance between the center axis of the separation gas nozzle 41 (42) and one side of the sector-shaped convex portion 4 is substantially equal to the other circumferential distance between the center axis of the separation gas nozzle 41 (42) and the other side of the sector-shaped convex portion 4. Incidentally, while the groove portion 43 is formed in order to bisect the convex portion 4 in this embodiment, the groove portion 42 is formed so that an upstream side of the convex portion 4 relative to the rotation direction of the turntable 7 is wider, in other embodiments.

With the above configuration, there are flat low ceiling surfaces 44 (first ceiling surfaces) on both sides of the separation gas nozzle 41 (42), and high ceiling surfaces 45 (second ceiling surfaces) outside of the corresponding low ceiling surfaces 44, as illustrated in FIG. 4A. The convex portion 4 (ceiling surface 44) provides a separation space, which is a thin or narrow space H, between the convex portion 4 and the turntable 7 in order to impede the first and the second gases from entering the thin space and from being mixed.

Referring to FIG. 4B, the $O_3$ gas is impeded from entering the space between the convex portion 4 and the turntable 7, the $O_3$ gas flowing toward the convex portion 4 from the reaction gas nozzle 32 along the rotation direction of the turntable 7, and the BTBAS gas is impeded from entering the space between the convex portion 4 and the turntable 7, the BTBAS gas flowing toward the convex portion 4 from the reaction gas nozzle 31 along the counter-rotation direction of the turntable 7. "The gases being impeded from entering" means that the $N_2$ gas as the separation gas ejected from the separation gas nozzle 41 diffuses between the first ceiling surfaces 44 and the upper surface of the turntable 7 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" means not only that the gases are completely prevented from entering the separation space, but that the gases cannot proceed farther toward the separation gas nozzle 41 and thus be mixed with each other even when a fraction of the reaction gases enters the separation space. Namely, as long as such effect is demonstrated, the separation area D is to separate the first process area P1 and the second process area P2. Incidentally, the BTBAS gas or the $O_3$ gas adsorbed on the wafer W can pass through below the convex portion 4. Therefore, the gases in "the gases being impeded from entering" mean the gases in a gaseous phase.

Referring to FIGS. 1, 2, and 3, a ring-shaped protrusion portion 5 is provided on a back surface of the ceiling plate 11 so that the inner circumference of the protrusion portion 5 faces the outer circumference of the core portion 71. The protrusion portion 5 opposes the turntable 7 at an outer area of the core portion 71. In addition, a back surface of the protrusion portion 5 and a back surface of the convex portion 4 form one plane surface. In other words, a height of the back surface of the protrusion portion 5 from the turntable 7 is the same as a height of the back surface of the convex portion 4, which will be referred to as a height h below. Incidentally, the convex portion 4 is formed not integrally with but separately from the protrusion portion 5 in other embodiments. FIGS. 2 and 3 illustrate the inner configuration of the vacuum chamber 1 whose top plate 11 is removed while the convex portions 4 remain inside the vacuum chamber 1.

The separation area D is configured by forming the groove portion 43 in a sector-shaped plate to be the convex portion 4, and locating the separation gas nozzle 41 (42) in the groove portion 43 in the present embodiment. However, two sector-shaped plates may be attached on the lower surface of the ceiling plate 11 by screws so that the two sector-shaped plates are located on both sides of the separation gas nozzle 41 (42).

In the present embodiment, the separation gas nozzle 41 (42) includes discharge holes of an opening diameter of, for example, 0.5 mm directed downward, which are arranged along a longitudinal direction of the nozzle at intervals of 10 mm. Similarly, each of the reaction gas nozzles 31 and 32 includes discharge holes of an opening diameter of, for example, 0.5 mm directed downward, which are arranged along a longitudinal direction of the nozzle at intervals of 10 mm.

In the present embodiment, when the wafer W having a diameter of about 300 mm is supposed to be processed in the vacuum chamber 1, the convex portion 4 has a circumferential length of, for example, about 140 mm along an arc that is at a distance 140 mm from the rotation center of the turntable 7, and a circumferential length of, for example, about 502 mm along an outer arc corresponding to the outermost portion of the concave portions 74 of the turntable 7. In addition, a circumferential length from one side wall of the convex portion 4 through the nearest side wall of the groove portion 43 along the outer arc lo is about 246 mm.

In addition, the height h (FIG. 4A) of the back surface of the convex portion 4, or the ceiling surface 44, measured from the top surface of the turntable 7 (or the wafer W) is, for example, about 0.5 mm through about 10 mm, and preferably about 4 mm. In this case, the rotational speed of the turntable 7 is, for example, 1 through 500 revolutions per minute (rpm). In order to ascertain the separation function performed by the separation area D, the size of the convex portion 4 and the height h of the ceiling surface 44 from the turntable 7 may be determined depending on the pressure in the chamber 1 and the rotational speed of the turntable 7 through experimentation. Incidentally, the separation gas is $N_2$ in this embodiment but may be an inert gas such as He and Ar, or $H_2$ in other embodiments, as long as the separation gas does not affect the deposition of silicon dioxide.

Figure 5:
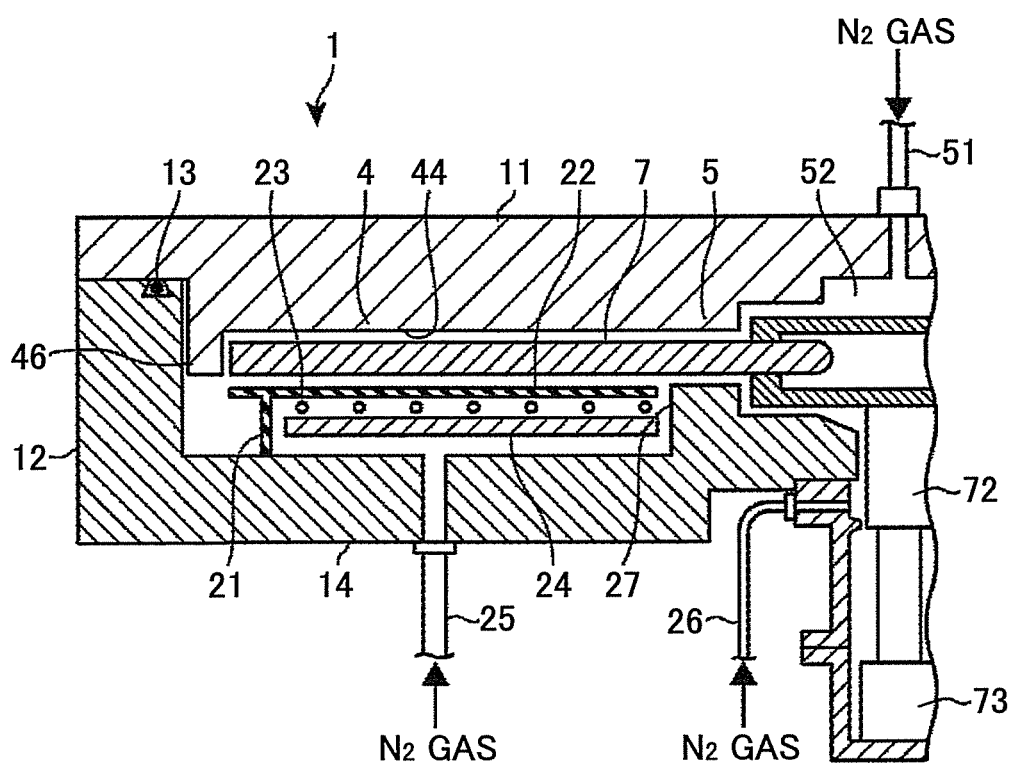
FIG. 5 is a vertical cross-sectional view illustrating a process area and a separation area in the film deposition apparatus.

FIG. 5 illustrates a cross-sectional view taken along a V-V line of FIG. 3, where the convex portion 4 is shown along with the protrusion portion 5 formed integrally with the convex portion 4. Referring to FIG. 5, the convex portion 4 has a bent portion 46 that bends in an L-shape at the outer circumferential edge of the convex portion 4. Although there are slight gaps between the bent portion 46 and the turntable 7 and between the bent portion 46 and the chamber body 12 because the convex portion 4 is attached on the back surface of the ceiling portion 11 and removed from the chamber body 12 along with the ceiling portion 11, the bent portion 46 substantially fills out a space between the turntable 7 and the chamber body 12, thereby preventing the first reaction gas (BTBAS) ejected from the first reaction gas nozzle 31 and the second reaction gas (ozone) ejected from the second reaction gas nozzle 32 from being mixed through the space between the turntable 7 and the chamber body 12. The gaps between the bent portion 46 and the turntable 7 and between the bent portion 46 and the chamber body 12 may be the same as the height h of the ceiling surface 44 from the turntable 7. In the illustrated example, a side wall facing the outer circumferential surface of the turntable 7 serves as an inner circumferential wall of the separation area D.

Now, referring again to FIG. 1, which is a cross-sectional view taken along a I-I line in FIG. 3, the chamber body 12 has an indented portion at the inner circumferential portion opposed to the outer circumferential surface of the turntable 7. The indented portion is referred to as an evacuation area 6 hereinafter. Below the evacuation area 6, there is an evacuation port 61 (see FIG. 3 for another evacuation port 62) which is connected to a vacuum pump 64 via an evacuation pipe 63, which can also be used for the evacuation port 62. In addition, the evacuation pipe 63 is provided with a pressure controller 65. Plural pressure controllers 65 may be provided to the corresponding evacuation ports 61, 62.

Referring again to FIG. 3, the evacuation port 61 is located between the first reaction gas nozzle 31 and the convex portion 4 that is located downstream relative to the clockwise rotation direction of the turntable 7 in relation to the first reaction gas nozzle 31, when viewed from above. With this configuration, the evacuation port 61 can substantially exclusively evacuate the BTBAS gas ejected from the reaction gas nozzle 31. On the other hand, the evacuation port 62 is located between the first reaction gas nozzle 32 and the convex portion 4 that is located downstream relative to the clockwise rotation direction of the turntable 7 in relation to the first reaction gas nozzle 32, when viewed from above. With this configuration, the evacuation port 62 can substantially exclusively evacuate the $O_3$ gas ejected from the reaction gas nozzle 32. Therefore, the evacuation ports 61, 62 so configured may assist the separation areas D to prevent the BTBAS gas and the $O_3$ gas from being mixed.

Although the two evacuation ports are provided in the chamber body 12 in this embodiment, three evacuation ports may be provided in other embodiments. For example, an additional evacuation port may be made in an area between the second reaction gas nozzle 32 and the separation area D located upstream relative to the clockwise rotation of the turntable 7 in relation to the second reaction gas nozzle 32. In addition, a further additional evacuation port may be made somewhere in the chamber body 12. While the evacuation ports 61, 62 are located below the turntable 7 to evacuate the chamber 1 through an area between the inner circumferential wall of the chamber body 12 and the outer circumferential surface of the turntable 7 in the illustrated example, the evacuation ports may be located in the side wall of the chamber body 12. In addition, when the evacuation ports 61, 62 are provided in the side wall of the chamber body 12, the evacuation ports 61, 62 may be located higher than the turntable 7. In this case, the gases flow along the upper surface of the turntable 7 into the evacuation ports 61, 62 located higher the turntable 7. Therefore, it is advantageous in that particles in the chamber 1 are not blown upward by the gases, compared to when the evacuation ports are provided, for example, in the ceiling plate 11.

Referring to FIG. 5, a separation gas supplying pipe 51 is connected to the top center portion of the ceiling plate 11 of the chamber 1, so that $N_2$ gas is supplied as a separation gas to a space 52 between the ceiling plate 11 and the core portion 71. The separation gas supplied to the space 52 flows through a narrow space or thin gap 50 between the protrusion portion 5 and the turntable 7 and then along the top surface of the turntable 7, and reaches the evacuation area 6. Because the space 52 and the thin gap 50 are filled with the $N_2$ gas, the reaction gases (BTBAS, $O_3$) cannot be mixed through the center portion of the turntable 7. In other words, the film deposition apparatus according to this embodiment is provided with a center area C that is defined by the center portion of the turntable 7 and the chamber 1 in order to isolate the first process area P1 and the second process area P2 and is configured to have an ejection opening that ejects the separation gas toward the top surface of the turntable 7. The ejection opening corresponds to the thin gap 50 between the protrusion portion 5 and the turntable 7, in the illustrated example.

Figure 6:
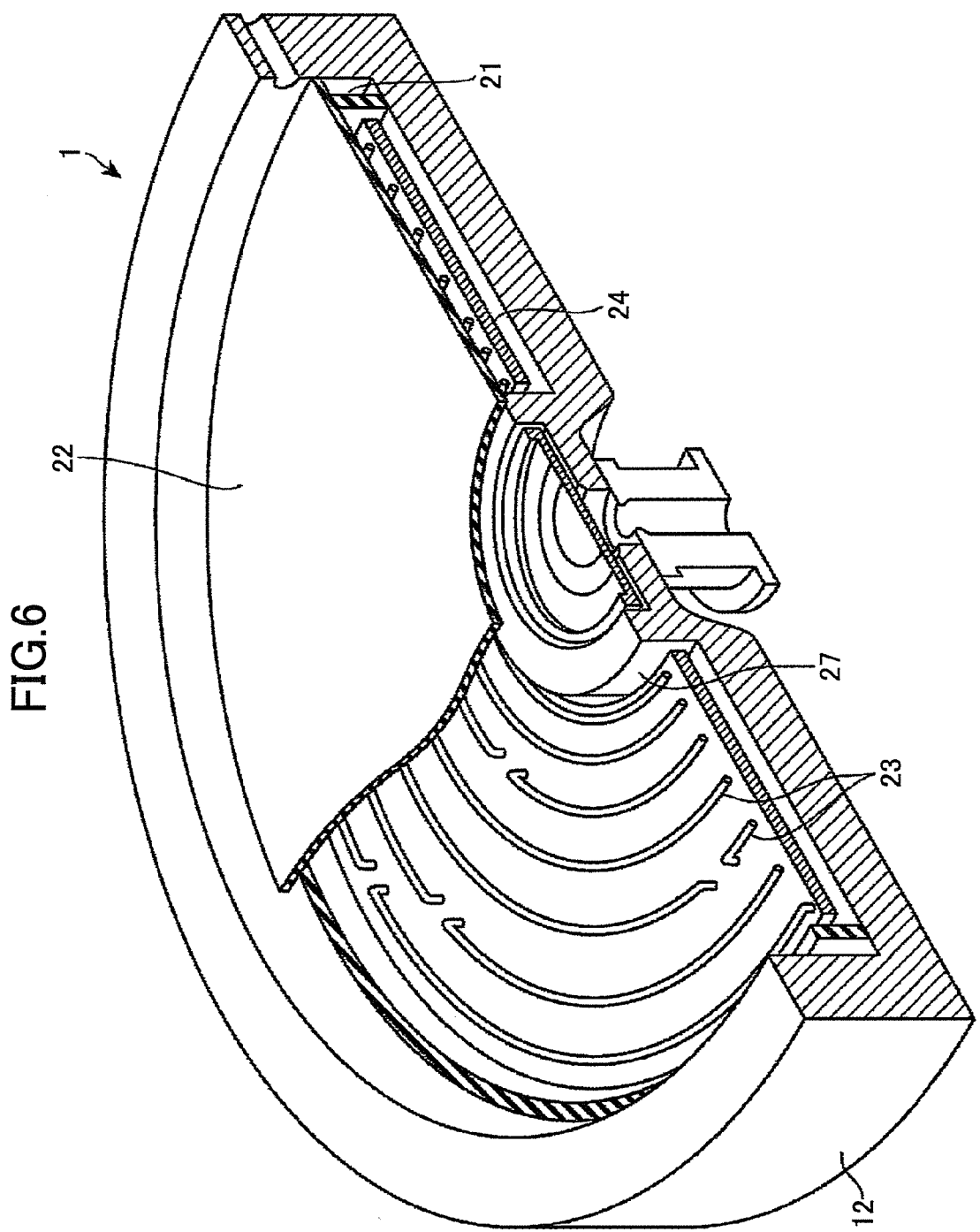
FIG. 6 is a perspective view illustrating an outline structure of a bottom part of the film deposition apparatus.
Figure 9:
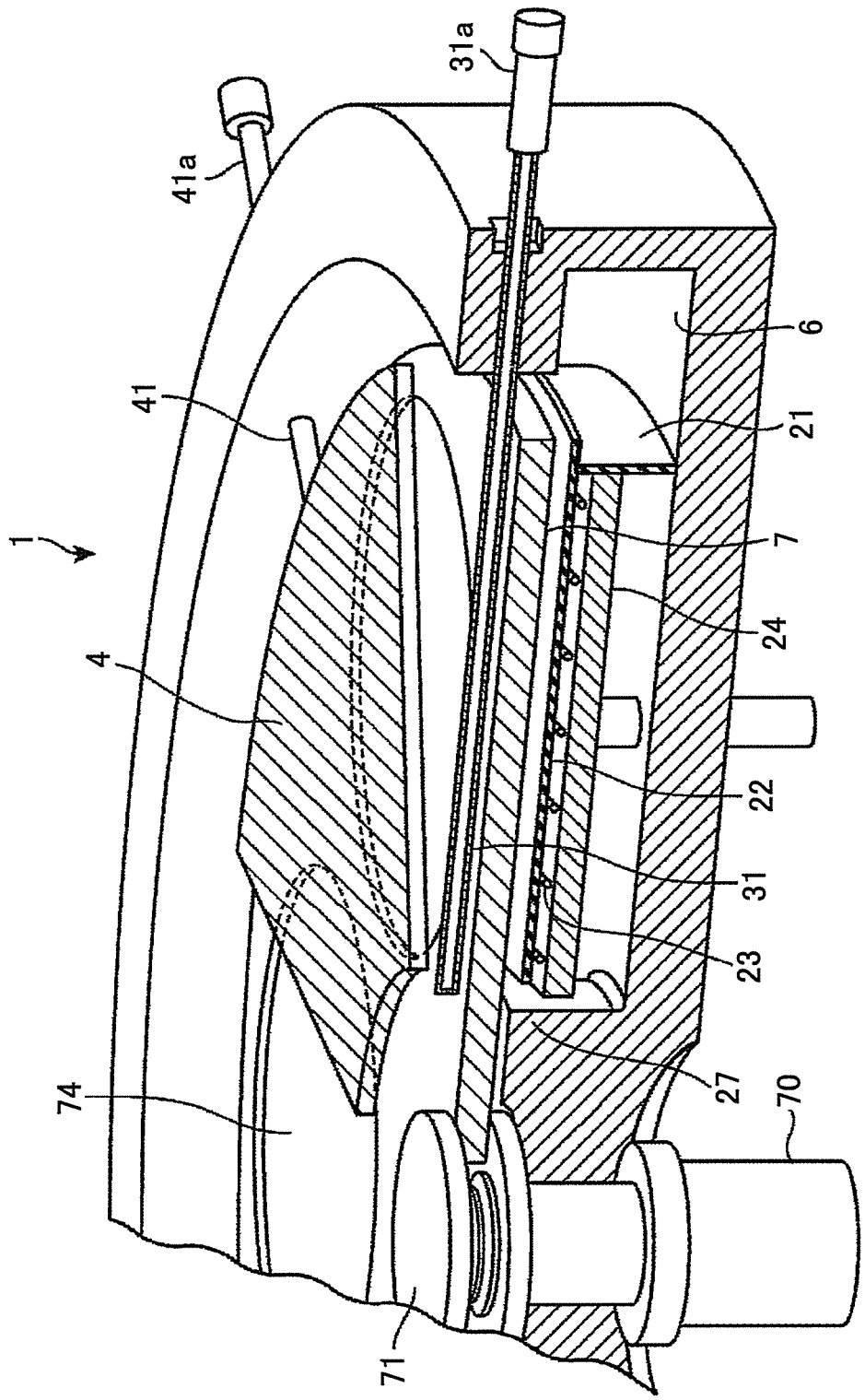
FIG. 9 is a partially cut-away perspective view of the film deposition apparatus.

On the other hand, as illustrated in FIG. 5, FIG. 6 and FIG. 9, many carbon wire heaters 23 are provided in a space between the turntable 7 and the bottom part 14 of the vacuum chamber 1. The wafer W on the turntable 7 is heated by the carbon wire heaters 23 at a temperature determined according to a process recipe. The carbon wire heater 23 contains string members (not shown in the figure), which are formed by braiding a plurality of fiber bundles made of pure carbon materials of a diameter of about 10 μm and containing less metal impurities. The string members are sealed in a sealing member made of ceramics, such as, for example, a quartz tube (for example, transparent quartz) having an outer diameter of several tens millimeters. The carbon wire heater 23 generates heat by an electric current being supplied to the carbon wire heater 23. The turntable 7 is heated from a lower side by radiation heat from the carbon wire heaters 23 in a vacuum atmosphere inside the vacuum chamber 1.

Figure 7:
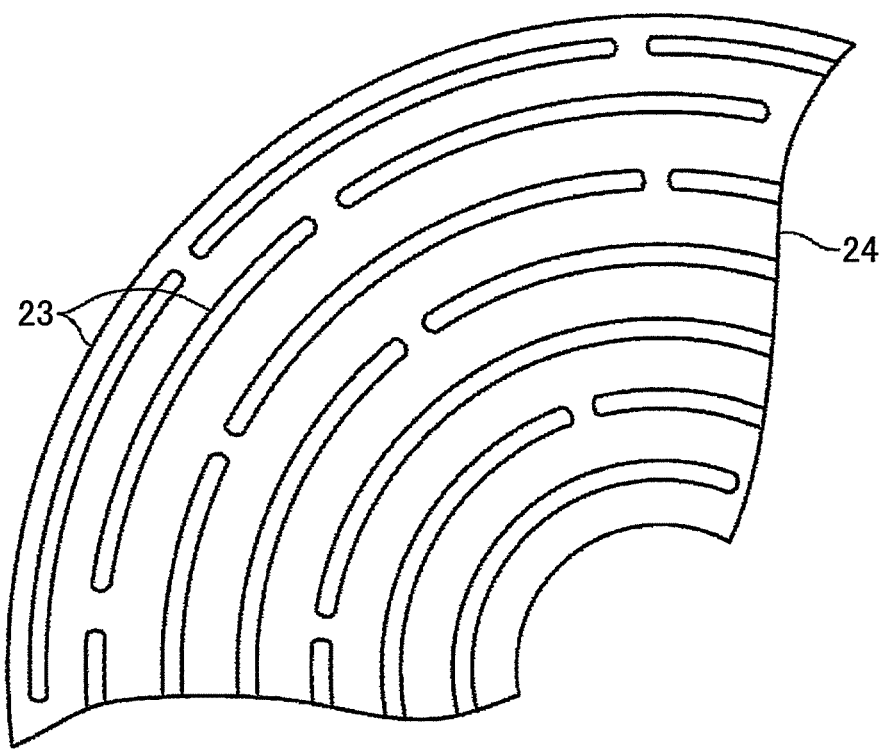
FIG. 7 is a plan view illustrating an arrangement state of a carbon wire heater of the film deposition apparatus.

As illustrated in FIG. 6 and FIG. 7, the carbon wire heaters 23 are provided on a reflective board 24 made of, for example, a stainless steel having a mirror polished surface. The radiation heat radiated downward from the carbon wire heaters 23 is reflected by the reflective board 24 toward the turntable 7, which permits efficient heating. The reflective board 24 is a flat disk having a diameter slightly smaller than the turntable 7, and is arranged under the turntable 7 and substantially parallel to the turntable 7.

As illustrated in FIG. 6 and FIG. 7, each elongated tubular carbon wire heater 23 is formed in a circular arc shape with a length of about ten and several centimeters to several tens of centimeters. By combining a plurality of circular arc heaters 23, the carbon wire heaters 23 are arranged on the reflective board 24 such as to draw a plurality of concentric circles having a center corresponding to the rotation shaft 72. Because the carbon wire heaters 23 are arranged in an entire area facing the bottom surface of the turntable 7, the entire turntable 7 can be heated uniformly. Here, the method of arranging the carbon wire heaters 23 is not limited to the concentric arrangement as illustrated in FIG. 6 and FIG. 7. For example, the carbon wire heaters 23 may be arranged in a whorl, which spreads from a center side of the reflective board 24 toward a circumferential side with the rotation shaft 72 serving as a center, or each carbon wire heater 23 may be formed in a straight line so that the carbon wire heaters 23 are arranged radially with the rotation shaft 72 serving as a center.

Figure 8:
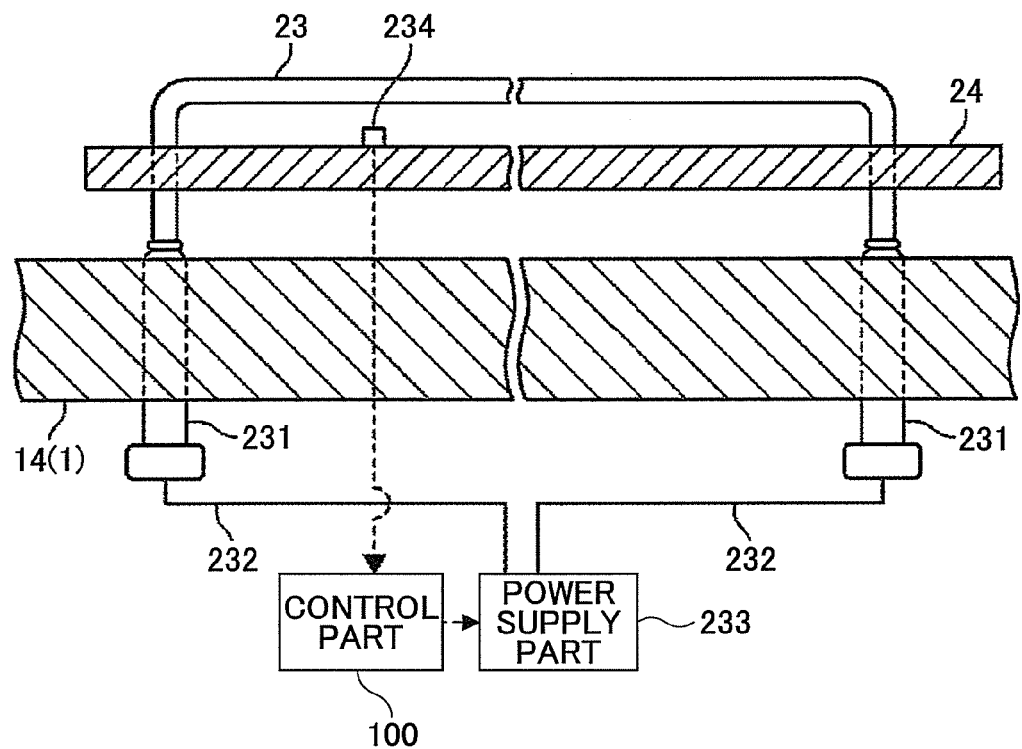
FIG. 8 is a cross-sectional view illustrating an attachment state of the carbon wire heater.

As illustrated in FIG. 8, each carbon wire heater 23 is arranged in a state where the carbon wire heater 23 is lifted above the reflective board 24 and parallel to the reflective board 24 when viewed from a side. Both ends of each carbon wire heater 23 are bent downward, and supported by and fixed to the bottom part 14 of the vacuum chamber 1 by penetrating through the reflective board 24. Connection ports 231 are provided in the bottom part 14, and both ends of each carbon wire heater 23 are connected to the connection ports 231, respectively. The connection ports 231 are drawn out of the vacuum chamber 1 by extending through the bottom part 14. The connection ports 231 are connected to a power supply part 233 via power supply lines 232.

The power supply part 233 adjusts a heating timing and an amount of power supply by controlling a power supply timing and a power supply amount based on an instruction from a control part 100 mentioned later. In the figure, a thermometer 234 is arranged on the reflective board 24. By adjusting a power supply amount to each of the plurality of carbon wire heaters 23 based on an instruction of the thermometer 234, for example, a control to heat the turntable 7 uniformly in a plane can be performed. It should be noted that, in each figure other than FIG. 8, an illustration of the carbon wire heaters 23 and the connection ports 231, which penetrate the reflective board 24 and extend downward, is omitted.

In the film deposition apparatus according to the present embodiment in which the carbon wire heaters 23 are arranged under the turntable 7 as mentioned above, the evacuation area 6, which is an inner surface of the vacuum chamber 1 being recessed outward, is formed in an outward and downward area of the outer edge surface of the turntable 7 as explained using FIG. 1 and FIG. 3. The reaction gases supplied to each of the process areas P1 and P2 are exhausted to the exhaust ports 61 and 62 through the evacuation area 6. If the reaction gases flowing in each evacuation area 6 enters the underside of the turntable 7, the gases may be mixed with each other and may form a reaction product on the carbon wire heaters 23. Such a reaction product may deteriorate a heating efficiency of the heaters 23 or may generate particles, which causes particle pollution of a wafer. Thus, the film deposition apparatus according to the present embodiment suppresses occurrence of the above-mentioned problem by suppressing entrance of reaction gases under the turntable 7.

As illustrated in FIG. 5 or FIG. 6, an outer sidewall member 21 is provided on an underside of the turntable 7 near the circumferential edge thereof. The outer sidewall member 21 is formed in a flat, circular tube shape in order to compartmentalize an atmosphere of an area from a space above the turntable 7 to the evacuation area 6 and an atmosphere in which the carbon wire heaters 23 are located. The outer sidewall member 21 is arranged to surround an area where the carbon wire heaters 23 are located, that is, to surround an entire outer circumference of the reflective board 24. Further, a cover member 22, which is an annular plate material having an outer diameter substantially the same as the diameter of the turntable 7, is provided on an upper end of the outer sidewall member 21.

Figure 12:
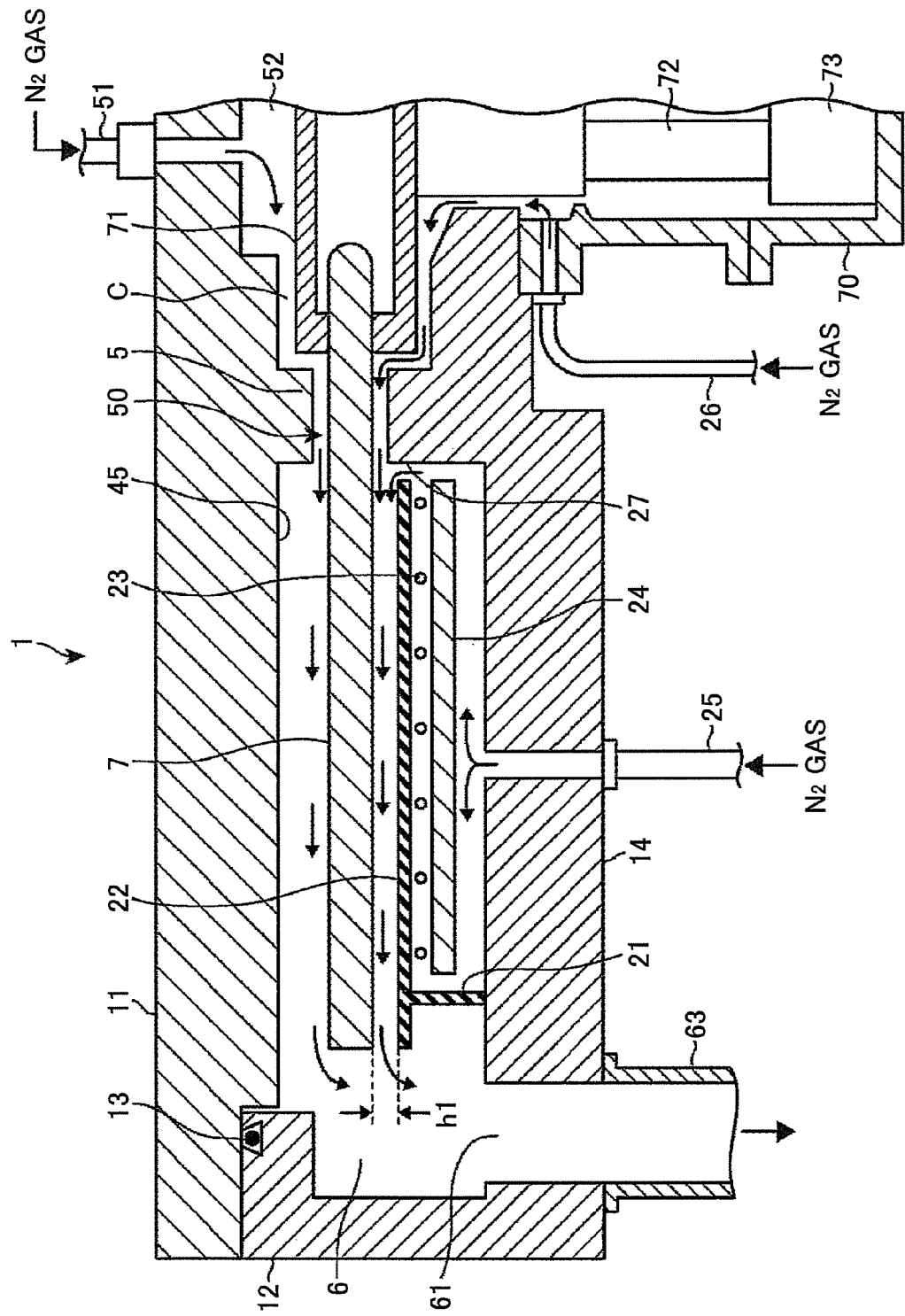
FIG. 12 is a cross-sectional view illustrating a condition of a flow of a separation gas or a purge gas.

The cover member 22 is arranged substantially parallel to the turntable 7 so that a position of the outer edge surface of the cover member 22 is coincident with a position of the outer edge surface of the turntable 7. As illustrated in FIG. 5, the cover member 22 is interposed between the bottom surface of the turntable 7 and the carbon wire heaters 23, when viewed from a side. Then, as illustrated in FIG. 12, a height h1 from the top surface of the cover member 22 to the bottom surface of the turntable 7 is in a range from 2 mm to 4 mm, and, preferably is 3 mm.

As illustrated in FIG. 5 and FIG. 6, in an inner area of the outer sidewall member 21, the cover member 22 covers an entire area above the area where the carbon wire heaters 23 are located on the reflective board 24. On the other hand, in an outer area of the outer sidewall member 21, the cover member 22 protrudes outward from the outer sidewall member 22 like a flange. The cover member 22 is formed by, for example, a transparent material such as a quartz, which can transmit radiation heat radiated from the carbon wire heaters 23 so that the turntable 7 is not prevented from being heated by the carbon wire heaters 23.

A cylindrical member 27 is provided in the bottom part 14 of the vacuum chamber 1 to surround the core portion 71 forming a part of the rotation shaft of the turntable 7. The cylindrical member 27 protrudes upward from the bottom part 14. The inner diameter of the annular cover member 22 is adjusted so that a gap is formed between the inner edge surface (inner edge) of the cover member 22 and the side circumferential surface of the cylindrical member 27.

In the above-mentioned structure, the turntable 7 and the cover member 22, which are two disk-like members, are arranged substantially parallel to each other. Thereby, a flat and thin or narrow space (first narrow space) having the height h1 is formed between the members 7 and 22. Thus, the reaction gas flowing to the evacuation area 6 through a side of the turntable 7 is prevented from entering a space under the turntable 7.

In the bottom part 14 of the vacuum chamber 1, purge gas supply pipes 25 are provided in a plurality of positions in a circumferential direction at a position under the reflective board 24. The purge gas supply pipes 25 correspond to a first purge gas supplying portion for purging the space in which the reflective board 24 and the carbon wire heaters 23 are located. Because this space communicates with the above-mentioned narrow space through a gap formed between the inner edge surface (inner edge) of the cover member 22 and the side circumferential surface of the cylindrical member 27, as mentioned above, purge gas supplied to the space concerned flows into the narrow spaces.

The top surface of the cylindrical member 27 is located near the center portion of the bottom surface of the turntable 7, that is, the core portion 71 so that a narrow or thin space is formed therebetween. Additionally, with respect to the through hole of the rotation shaft 72 surrounded by the cylindrical member 27, a gap between the inner surface thereof and the rotation shaft 27 is narrow. These narrow spaces are communicated with inside the case body 70. Thus, a supply pipe 26 is provided to the case body 70. The supply pipe 26 corresponds to a second purge gas supplying portion for purging the narrow spaces by supplying $N_2$ gas as a purge gas to the narrow spaces. That is, a purge gas is supplied to the above-mentioned narrow spaces also from an inner side of the cylindrical member 27.

Figure 10:
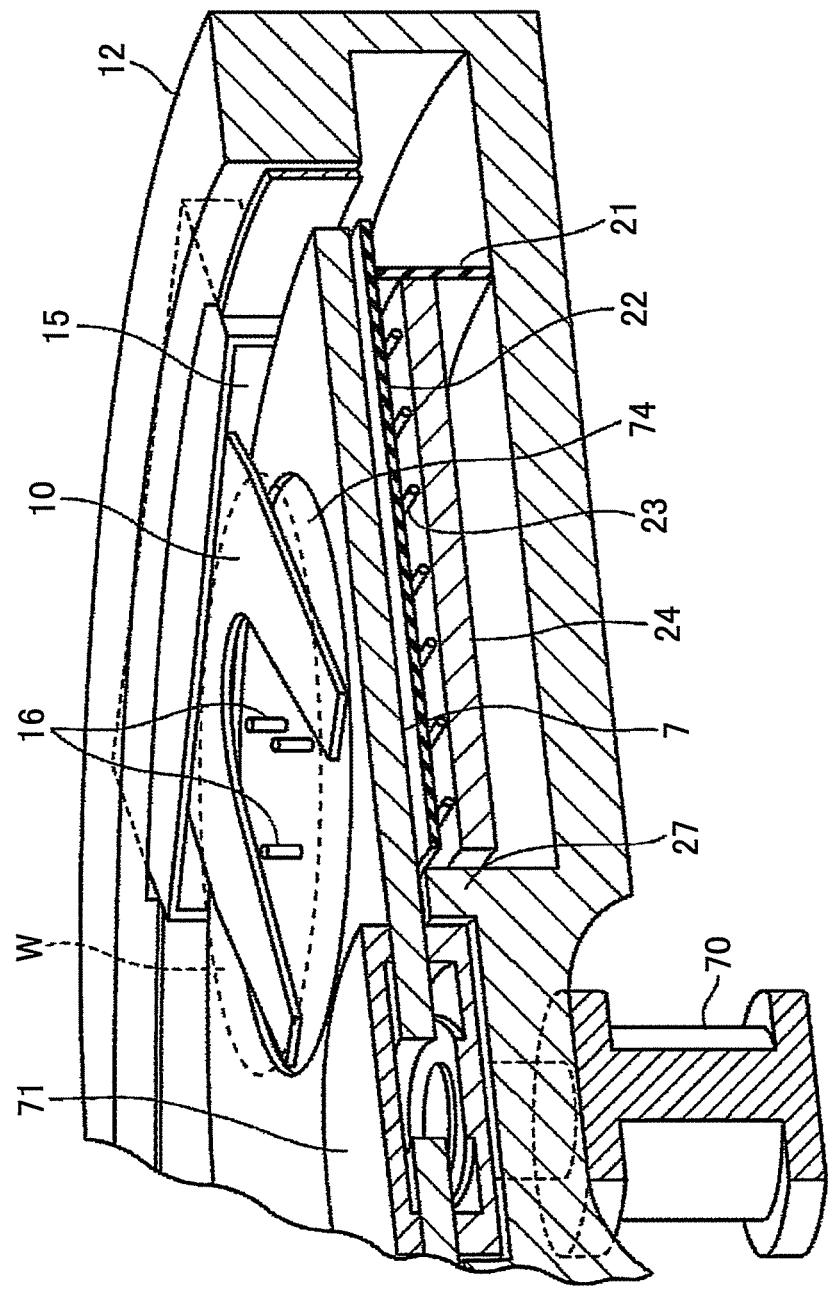
FIG. 10 is a partially cut-away perspective view of the film deposition apparatus.

In addition, a transfer opening 15 is formed in a side wall of the chamber body 12 as shown in FIG. 2, FIG. 3 and FIG. 10. Through the transfer opening 15, the wafer W is transferred into or out from the chamber 1 by a transfer arm 10 (FIGS. 3 and 8). The transfer opening 15 is provided with a gate valve (not shown) by which the transfer opening 15 is opened or closed. When the concave portion 74 of the turntable 7 is in alignment with the transfer opening 15 and the gate valve is opened, the wafer W is transferred into the chamber 1 and placed in the concave portion 74 as a wafer receiving portion of the turntable 7 from the transfer arm 10. In order to lower the wafer W into the concave portion 74 or raise the wafer W from the concave portion 74, there are provided elevation pins 16 (FIG. 10) that are raised or lowered through corresponding through holes formed in the concave portion 74 of the turntable 7 by an elevation mechanism (not illustrated in the figure).

In addition, the film deposition apparatus according to this embodiment is provided with a control portion 100 that controls total operations of the deposition apparatus. The control portion 100 includes a process controller 100a formed of, for example, a computer, a user interface portion 100b, and a memory device 100c. The user interface portion 100b has a display that shows operations of the film deposition apparatus, and an input/output (I/O) device including a key board and a touch panel that allows an operator of the film deposition apparatus to select a process recipe and an administrator of the film deposition apparatus to change parameters in the process recipe.

The memory device 100c stores a control program and a process recipe that cause the controlling portion 100 to carry out various operations of the deposition apparatus, and various parameters in the process recipe. These programs have groups of steps for carrying out the operations described later, for example. These programs are installed into and run by the process controller 100a by instructions from the user interface portion 100b. In addition, the programs are stored in a computer readable storage medium 100d and installed into the memory device 100c from the storage medium 100d. The computer readable storage medium 100d may be a hard disk, a compact disc, a magneto optical disk, a memory card, a floppy disk, or the like. Moreover, the programs may be downloaded to the memory device 100c through a communications network.

Next, operations of the film deposition apparatus according to this embodiment of the present invention are described. First, the turntable 7 is rotated so that the concave portion 74 is in alignment with the transfer opening 15, and the gate valve (not shown) is open. Second, the wafer W is brought into the chamber 1 through the transfer opening 15 by the transfer arm 10. The wafer W is received by the elevation pins 16 and lowered to the concave portion 74 by the elevation pins 16 driven by the elevation mechanism (not illustrated in the figure) after the transfer arm 10 is pulled away from the chamber 1. Then, the series of operations above are repeated five times, and thus five wafers W are loaded on the turntable 7. Next, the vacuum pump 64 (FIG. 1) is activated in order to maintain the chamber 1 at a predetermined reduced pressure. The turntable 7 starts rotating clockwise when seen from above. The turntable 7 is heated by radiation heat from the carbon wire heaters 23 to a predetermined temperature (e.g., 300° C.) in advance by the heater unit 7, which in turn heats the wafers W on the turntable 7. After the wafers W are heated and maintained at the predetermined temperature, which may be confirmed by a temperature sensor (not shown), the first reaction gas (BTBAS) is supplied to the first process area P1 through the first reaction gas nozzle 31, and the second reaction gas ($O_3$) is supplied to the second process area P2 through the second reaction gas nozzle 32. In addition, the separation gases ($N_2$) are supplied to the separation areas D through the separation nozzles 41, 42.

The wafer W alternately passes through the first process area P1, in which the first reaction gas nozzle 31 is provided, and the second process area P2, in which the second reaction gas nozzle 32 is provided. Thereby, the BTBAS gas is adsorbed onto the wafer W, and, then, the $O_3$ gas is adsorbed onto the wafer W, which results in oxidation of the BTBAS molecules and formation of one or a plurality of silicon oxide molecular layers. Thus, the silicon oxide molecular layers are laminated sequentially, thereby forming a silicon oxide film having a predetermined film thickness.

In addition, during the deposition operations above, the $N_2$ gas as the separation gas is supplied from the separation gas supplying pipe 51, and is ejected toward the top surface of the turntable 7 from the center area C, that is, the gap 50 between the protrusion portion 5 and the turntable 7. In this embodiment, a space below the second ceiling surface 45, where the reaction gas nozzle 31 (32) is arranged, has a lower pressure than the center area C and the thin space between the first ceiling surface 44 and turntable 7. This is because the evacuation area 6 is provided adjacent to the space below the ceiling surface 45 and the space is directly evacuated through the evacuation area 6. Additionally, it is partly because the thin space is provided so that the height h can maintain the pressure difference between the thin space and the place where the reaction gas nozzle 31 (32) or the first (the second) process area P1 (P2) is located.

Figure 11:
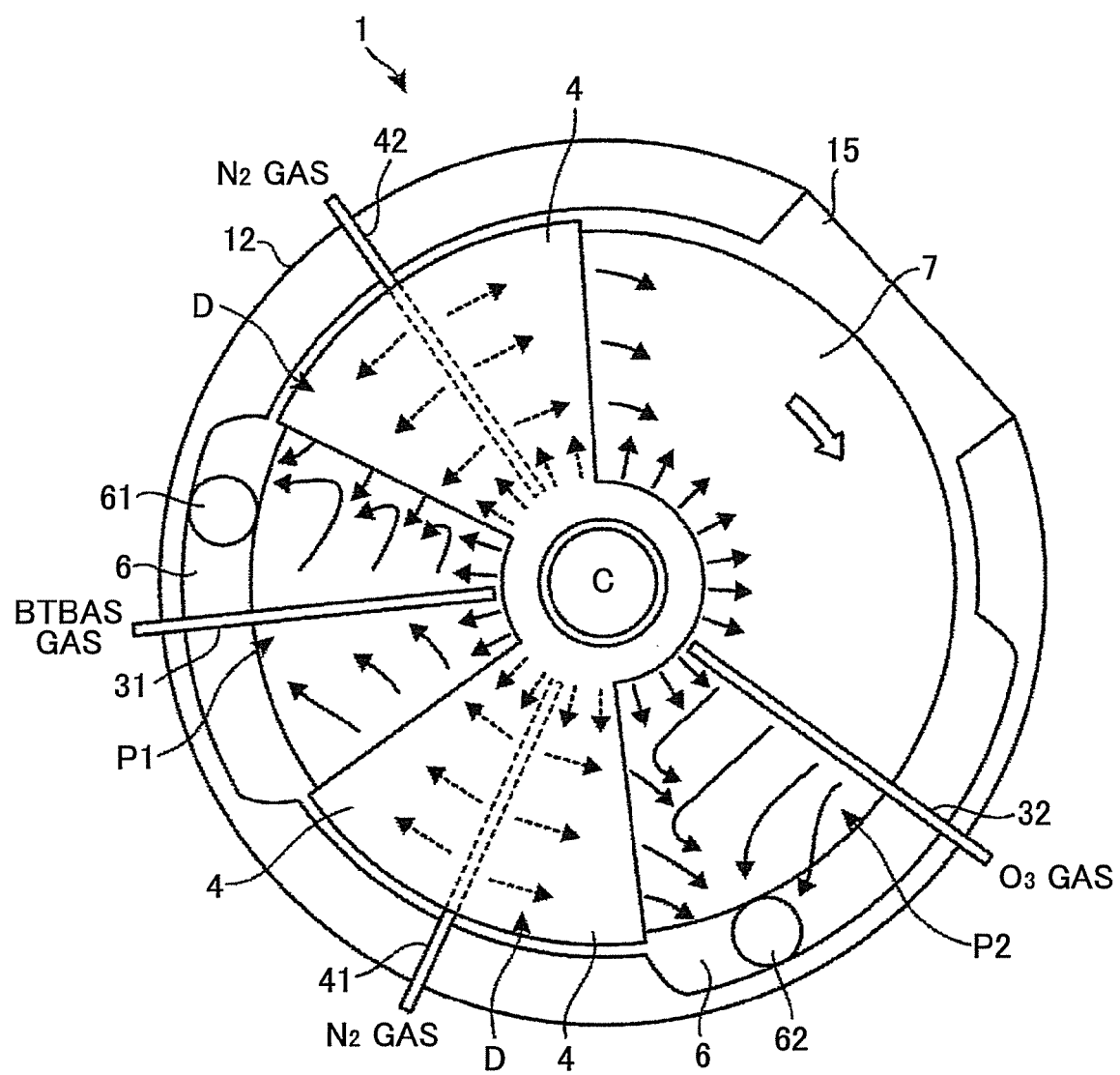
FIG. 11 is a plan view illustrating a condition of a first reaction gas and a second reaction gas being separated by a separation gas and exhausted.

Next, the flow patterns of the gases supplied into the chamber 1 from the gas nozzles 31, 32, 41, 42 are described in reference to FIG. 11, which schematically shows the flow patterns. As shown, part of the $O_3$ gas ejected from the second reaction gas nozzle 32 hits and flows along the top surface of the turntable 7 (and the surface of the wafer W) in a direction opposite to the rotation direction of the turntable 7. Then, the $O_3$ gas is pushed back by the $N_2$ gas flowing along the rotation direction, and changes the flow direction toward the edge of the turntable 7 and the inner circumferential wall of the chamber body 12. Finally, this part of the $O_3$ gas flows into the evacuation area 6 and is evacuated from the chamber 1 through the evacuation port 62.

Another part of the $O_3$ gas ejected from the second reaction gas nozzle 32 hits and flows along the top surface of the turntable 7 (and the surface of the wafers W) in the same direction as the rotation direction of the turntable 7. This part of the $O_3$ gas mainly flows toward the evacuation area 6 due to the $N_2$ gas flowing from the center portion C and suction force through the evacuation port 62. On the other hand, a small portion of this part of the $O_3$ gas flows toward the separation area D located downstream of the rotation direction of the turntable 7 in relation to the second reaction gas nozzle 32 and may enter the gap between the ceiling surface 44 and the turntable 7. However, because the height h of the gap is designed so that the $O_3$ gas is impeded from flowing into the gap at film deposition conditions intended, the small portion of the $O_3$ gas cannot flow into the gap. Even when a small fraction of the $O_3$ gas flows into the gap, the fraction of the $O_3$ gas cannot flow farther into the separation area D, because the fraction of the $O_3$ gas can be pushed backward by the $N_2$ gas ejected from the separation gas nozzle 41. Therefore, substantially all the part of the $O_3$ gas flowing along the top surface of the turntable 7 in the rotation direction flows into the evacuation area 6 and is evacuated by the evacuation port 62, as illustrated in FIG. 11.

Similarly, part of the BTBAS gas ejected from the first reaction gas nozzle 31 to flow along the top surface of the turntable 7 (and the surface of the wafers W) in a direction opposite to the rotation direction of the turntable 7 is prevented from flowing into the gap between the turntable 7 and the ceiling surface 44 of the convex portion 4 located upstream relative to the rotation direction of the turntable 7 in relation to the first reaction gas supplying nozzle 31. Even if only a fraction of the BTBAS gas flows into the gap, the BTBAS gas is pushed backward by the $N_2$ gas ejected from the separation gas nozzle 41 in the separation area D. The BTBAS gas pushed backward flows toward the outer circumferential edge of the turntable 7 and the inner circumferential wall of the chamber body 12, along with the $N_2$ gases from the separation gas nozzle 41 and the center portion C, and then is evacuated by the evacuation port 61 through the evacuation area 6.

Another part of the BTBAS gas ejected from the first reaction gas nozzle 31 to flow along the top surface of the turntable 7 (and the surface of the wafers W) in the same direction as the rotation direction of the turntable 7, cannot flow into the gap between the turntable 7 and the ceiling surface 44 of the convex portion 4 located downstream relative to the rotation direction of the turntable 7 in relation to the first reaction gas supplying nozzle 31. Even if a fraction of this part of the BTBAS gas flows into the gap, this BTBAS gas is pushed backward by the $N_2$ gases ejected from the center portion C and the separation gas nozzle 42 in the separation area D. The BTBAS gas pushed backward flows toward the evacuation area 6, along with the $N_2$ gases from the separation gas nozzle 41 and the center portion C, and then is evacuated by the evacuation port 61.

As stated above, the separation areas D may prevent the BTBAS gas and the $O_3$ gas from flowing thereinto, or may greatly reduce the amount of the BTBAS gas and the $O_3$ gas flowing thereinto, or may push the BTBAS gas and the $O_3$ gas backward. The BTBAS molecules and the $O_3$ molecules adsorbed on the wafer W are allowed to go through the separation area D, contributing to the film deposition.

Additionally, the BTBAS gas in the first process area P1 (the $O_3$ gas in the second process area P2) is prevented from flowing into the center area C, because the separation gas is ejected toward the outer circumferential edge of the turntable 7 from the center area C, as illustrated in FIG. 7 and FIG. 12. Even if a fraction of the BTBAS gas in the first process area P1 (the $O_3$ gas in the second process area P2) flows into the center area C, the BTBAS gas ($O_3$ gas) is pushed backward, so that the BTBAS gas in the first process area P1 (the $O_3$ gas in the second process area P2) is prevented from flowing into the second process area P2 (the first process area P1) through the center area C.

Moreover, the BTBAS gas of the first process area P1 (the $O_3$ gas of the second process area P3) is prevented from flowing into the second process area P2 (the first process area P1) through the space between the turntable 7 and the inner wall of the chamber body 12. This is because the bent part 46 is formed downward from the convex portion 4, and a gap between the bent part 46 and the turntable 7 and the gap between the bent part 46 and the inner wall of the chamber body 12 substantially eliminate pressure communication between the two process areas because the gaps are as small as the height h of the ceiling surface 44 of the convex portion 4 from the turntable 7. Accordingly, the BTBAS gas is evacuated from the evacuation port 61, and the $O_3$ gas is evacuated from the evacuation port 62, and thus the two reaction gases are not mixed. In addition, the space below the turntable 7 is purged by the $N_2$ gas supplied from the purge gas supplying pipes 25, 16. Therefore, the BTBAS gas cannot flow through below the turntable 7 into the second process area P2.

After the film deposition process is completed, each wafer W is carried out of the vacuum chamber 1 by the conveyance arm 10 according to a reverse operation of the carry-in operation.

An example of process parameters preferable in the film deposition apparatus according to this embodiment is listed below.

rotational speed of the turntable 7: 1-500 rpm (in the case of the wafer W having a diameter of 300 mm)
pressure in the chamber 1: 1067 Pa (8 Torr)
wafer temperature: 300-350° C.
flow rate of BTBAS gas: 100 sccm
flow rate of $O_3$ gas: 10000 sccm
flow rate of $N_2$ gas from the separation gas nozzles 41, 42: 20000 sccm
flow rate of $N_2$ gas from the separation gas supplying pipe 51: 5000 sccm
flow rate of $N_2$ gas supplied from the purge gas supply pipe 25 to the arrangement space of the carbon wire heaters 23: 1000 sccm
flow rate of $N_2$ gas supplied from the purge gas supply pipe 25 into the case body 70: 1000 sccm
the number of rotations of the turntable 7: 600 revolutions (depending on the film thickness required)

According to the film deposition apparatus of this embodiment, because the film deposition apparatus has the separation areas D including the low ceiling surface 44 between the first process area P1, to which the BTBAS gas is supplied from the first reaction gas nozzle 31, and the second process area P2, to which the $O_3$ gas is supplied from the second reaction gas nozzle 32, the BTBAS gas ($O_3$ gas) is prevented from flowing into the second process area P2 (the first process area P1) and being mixed with the $O_3$ gas (BTBAS gas). Therefore, an MLD (or ALD) mode deposition of silicon dioxide is assuredly performed by rotating the turntable 7 on which the wafers W are placed in order to allow the wafers W to pass through the first process area P1, the separation area D, the second process area P2, and the separation area D. In addition, the separation areas D further include the separation gas nozzles 41, 42 from which the $N_2$ gases are ejected in order to further assuredly prevent the BTBAS gas ($O_3$ gas) from flowing into the second process area P2 (the first process area P1) and being mixed with the $O_3$ gas (BTBAS gas). Moreover, because the chamber 1 of the film deposition apparatus according to this embodiment has the center area C having the ejection holes from which the $N_2$ gas is ejected, the BTBAS gas ($O_3$ gas) is prevented from flowing into the second process area P2 (the first process area P1) through the center area C and being mixed with the $O_3$ gas (BTBAS gas). Furthermore, because the BTBAS gas and the $O_3$ gas are not mixed, almost no deposits of silicon dioxide are made on the turntable 7, thereby reducing particle problems.

Incidentally, although the turntable 7 has the five concave portions 74 and five wafers W placed in the corresponding concave portions 74 can be processed in one run in this embodiment, only one wafer W is placed in one of the five concave portions 74, or the turntable 7 may have only one concave portion 74.

Moreover, because a relative positional relationship between the evacuation ports and the reaction gas nozzles changes by the minute in the case where the evacuation ports are provided in the turntable or the case where the wafer placement table is fixed and the reaction gas nozzles are rotated, the evacuation gas flow may be changed in an unstable condition, and, thereby, there may be concern about the first reaction gas and the second reaction gas being mixed with each other and concern about deterioration of uniformity in film deposition. On the other hand, in the above-mentioned embodiment, because the positional relationship between the reaction gas nozzle 31 (32) and the evacuation port 61 (62) is fixed, the evacuation gas flow is constant and there is no concern mentioned above, which permits a stable film deposition process being performed.

Figure 13:
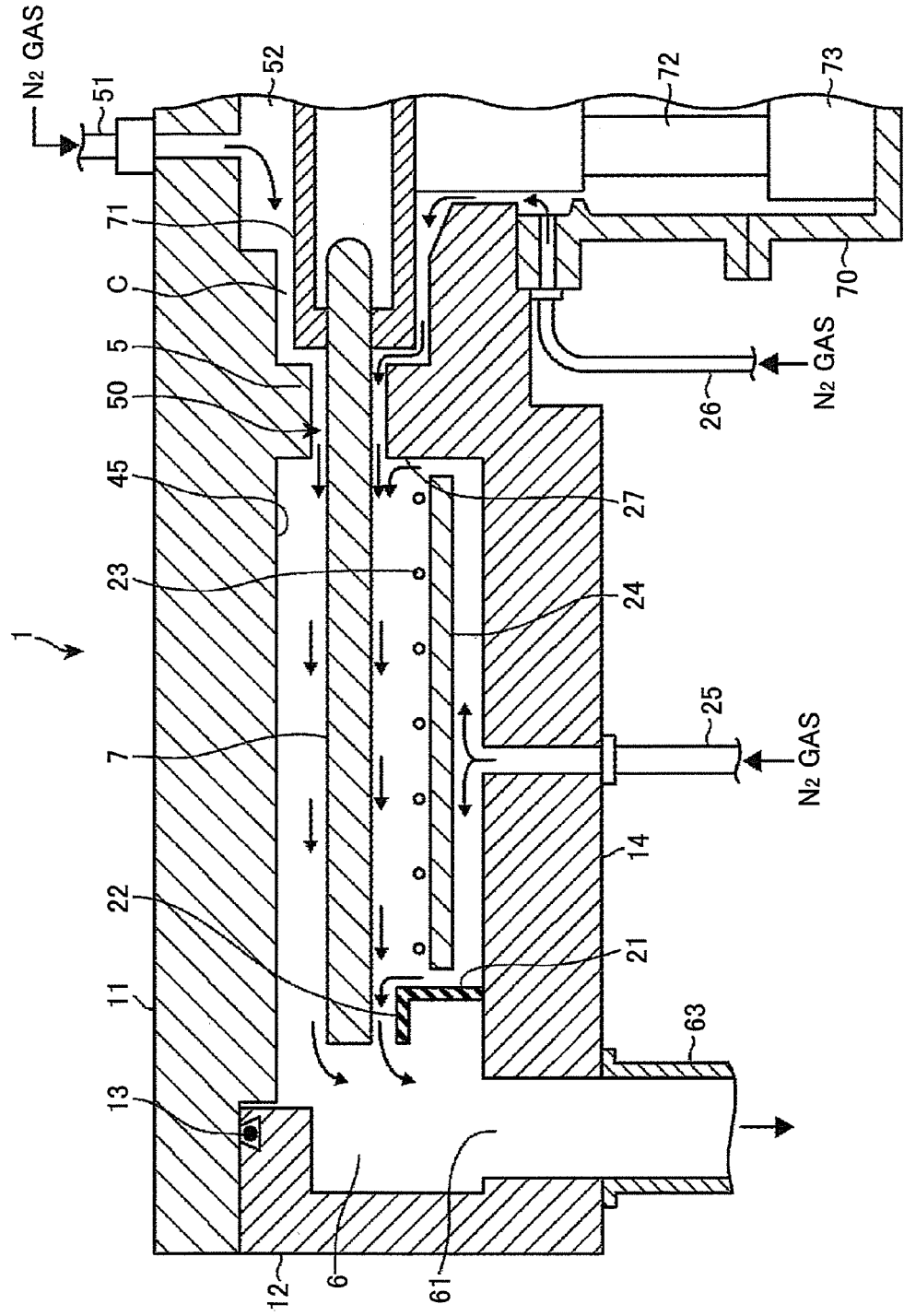
FIG. 13 is a cross-sectional view illustrating another structure of the bottom part of the film deposition apparatus.

Here, the structure of the members forming the narrow space between the turntable 7 is not limited to the case as indicated in the above-mentioned embodiment where the cover member 22 extends on the inner side of the outer sidewall member 21 and covers the entire area where the carbon wire heaters 23 are located. For example, the reaction gas is prevented from entering the space under the turntable 7 by providing only the cover member 22, which extends outward from the outer sidewall member 21 like a flange to form the first narrow space between the cover member 22 and the bottom surface of the turntable 7, as illustrated in FIG. 13.

Additionally, the first narrow space to prevent an entrance of a reaction gas may be formed between the inner circumferential surface of the outer sidewall member 21 and the outer edge surface of the turntable 7 by arranging the outer sidewall member 21 at a position outside in a radial direction of the turntable 7 and extending at the top end thereof to a position opposite to the outer edge surface of the turntable 7 without providing the cover member 22, which extends inward or outward from the outer sidewall member 21. In this example, the top end part of the outer sidewall member 21, which extends upward, corresponds to a member for forming the narrow space between the member and the turntable 7.

Furthermore, the outer sidewall member 21 may be arranged at a position surrounding the outer side of the turntable 7 in a radial direction in an area where the carbon wire heaters 23 are provided, and an inner sidewall member 211 may be further provided at a position surrounding an inner side of the area in a radial direction, and the cover member 22 may be provided so that a sealed space, which covers the members 21 and 211 and accommodates the heaters 23, is formed. In such a case, it is preferable that, for example, an evacuation pipe 281 connected to the vacuum pump 64 is provided in the bottom part 14 of the vacuum chamber 14 in order to maintain a pressure inside the sealed space higher than a pressure of the outside space, that is, a pressure in the vacuum chamber 1 on the side of the area where the turntable 7 is located. In this example, a pressure adjusting part including, for example, a pressure gauge 282 and a pressure adjusting valve 283 is provided on the side of the evacuation pipe 281 so that the pressure inside the sealed space can be controlled by the control part independently from a pressure of an outside space.

The heater for heating the turntable 7 is not limited to the carbon wire heater 23, and, for example, a lamp heater may be used. Although a member (for example, the cover member 22) for forming a narrow space (the first narrow space) along the entire outer circumference of the turntable 7 is arranged in the above-mentioned embodiment, the member for forming the narrow space is not always arranged in the separation area D because a reaction gas does not flow into the separation area D. In other words, it is necessary to provide the member for forming the narrow space at least in areas corresponding to the separation areas D adjacent to each other in a rotating direction of the turntable 7.

The reaction gases that may be used in the film deposition apparatus according to an embodiment of the present invention are dichlorosilane (DCS), hexachlorodisilane (HCD), Trimethyl Aluminum (TMA), tetrakis-ethyl-methyl-aminozirconium (TEMAZr), tris(dimethyl amino) silane (3DMAS), tetrakis-ethyl-methyl-amino-hafnium (TEMHf), bis(tetra methyl heptandionate) strontium (Sr(THD)$_2$), (methyl-pentadionate)(bis-tetra-methyl-heptandionate) titanium (Ti(MPD)(THD)), monoamine-silane, or the like.

Because a larger centrifugal force is applied to the gases in the chamber 1 at a position closer to the outer circumference of the turntable 7, the BTBAS gas, for example, flows toward the separation area D at a higher speed in the position closer to the outer circumference of the turntable 7. Therefore, the BTBAS gas is more likely to enter the gap between the ceiling surface 44 and the turntable 7 in the position closer to the circumference of the turntable 7. Because of this situation, when the convex portion 4 has a greater width (a longer arc) toward the circumference, the BTBAS gas cannot flow farther into the gap in order to be mixed with the O$_3$ gas. In view of this, it is preferable for the convex portion 4 to have a sector-shaped top view, as explained in the above embodiment.

Figure 16A:
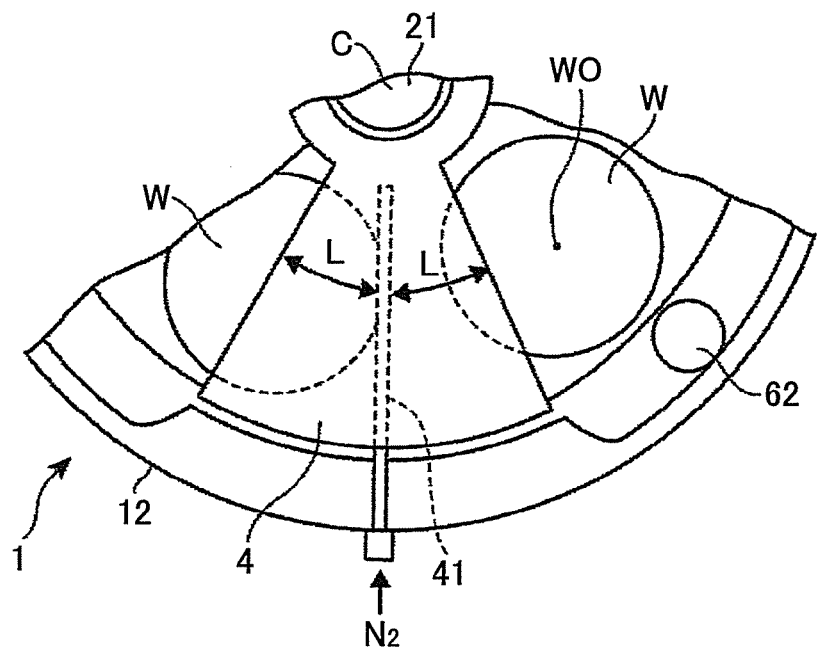
FIGS. 16A and 16B are illustrations for explaining an example of dimensions of a convex part used for a separation area.
Figure 16B:
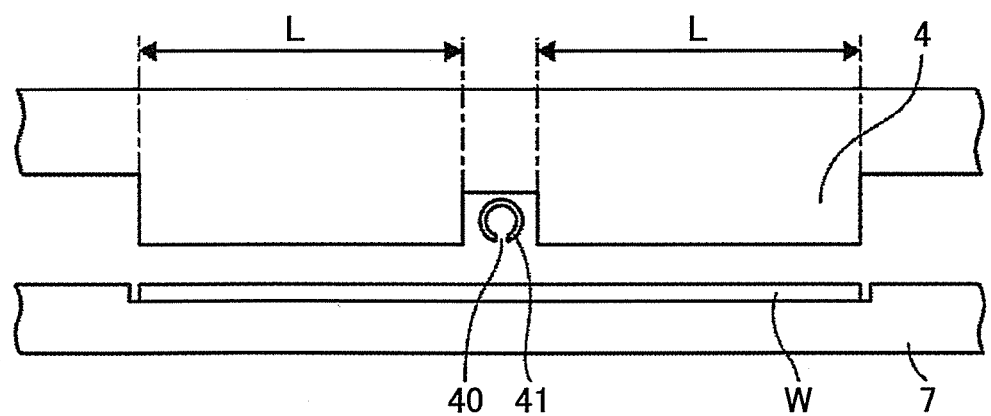
Figure 17:
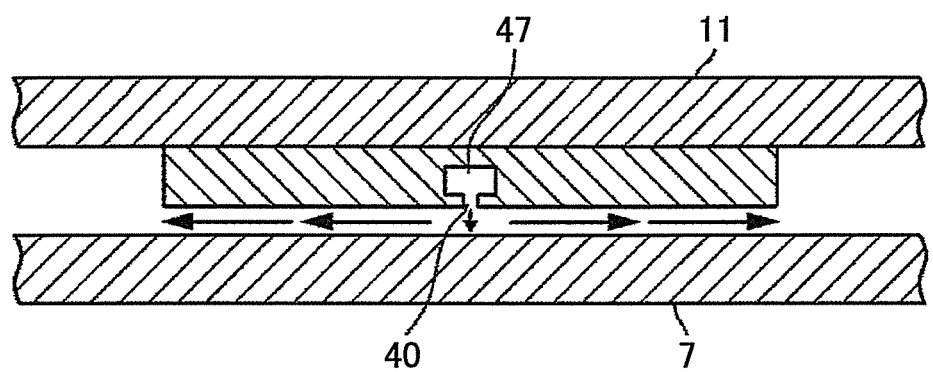
FIG. 17 is a vertical cross-sectional view illustrating another example of the separation area.

The size of the convex portion 4 (or the ceiling surface 44) is exemplified again below. Referring to FIGS. 16A and 16B, the ceiling surface 44 that creates the thin space in both sides of the separation gas nozzle 41 (42) may preferably have a length L ranging from about one-tenth of a diameter of the wafer W through about a diameter of the wafer W, preferably, about one-sixth or more of the diameter of the wafer W along an arc that corresponds to a route through which a wafer center WO passes. Specifically, the length L is preferably about 50 mm or more when the wafer W has a diameter of 300 mm. When the length L is small, the height h of the thin space between the ceiling surface 44 and the turntable 7 (wafer W) has to be accordingly small in order to effectively prevent the reaction gases from flowing into the thin space. However, when the length L becomes too small and thus the height h has to be extremely small, the turntable 7 may hit the ceiling surface 44, which may cause wafer breakage and wafer contamination through particle generation. Therefore, measures to damp vibration of the turntable 7 or measures to stably rotate the turntable 7 are required in order to prevent the turntable 7 hitting the ceiling surface 44. On the other hand, when the height h of the thin space is kept relatively greater while the length L is small, a rotation speed of the turntable 7 has to be lower in order to prevent the reaction gases flowing into the thin gap between the ceiling surface 44 and the turntable 7, which is rather disadvantageous in terms of production throughput. From these considerations, the length L of the ceiling surface 44 along the arc corresponding to the route of the wafer center WO is preferably about 50 mm or more when the wafers W having a diameter of 300 mm are processed, as stated above. However, the size of the convex portion 4 or the ceiling surface 44 is not limited to the above size, but may be adjusted depending on the process parameters and the size of the wafer to be used. In addition, as clearly understood from the above explanation, the height h of the thin space may be adjusted depending on an area of the ceiling surface 44 in addition to the process parameters and the size of the wafer to be used, as long as the thin space has a height that allows the separation gas to flow from the separation area D through the process area P1 (P2).

Figure 14:
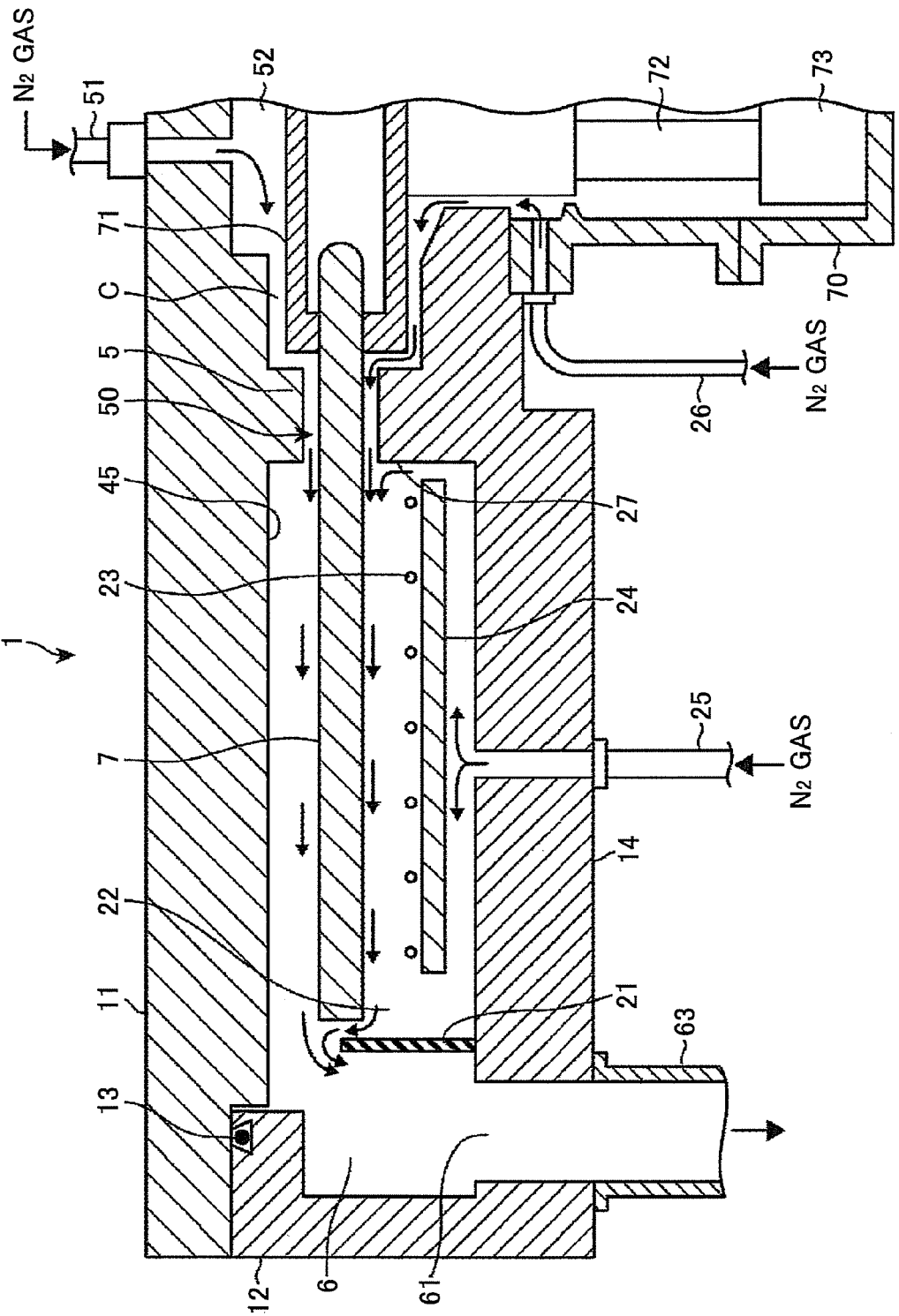
FIG. 14 is a cross-sectional view illustrating a further structure of the bottom part of the film deposition apparatus.
Figure 15:
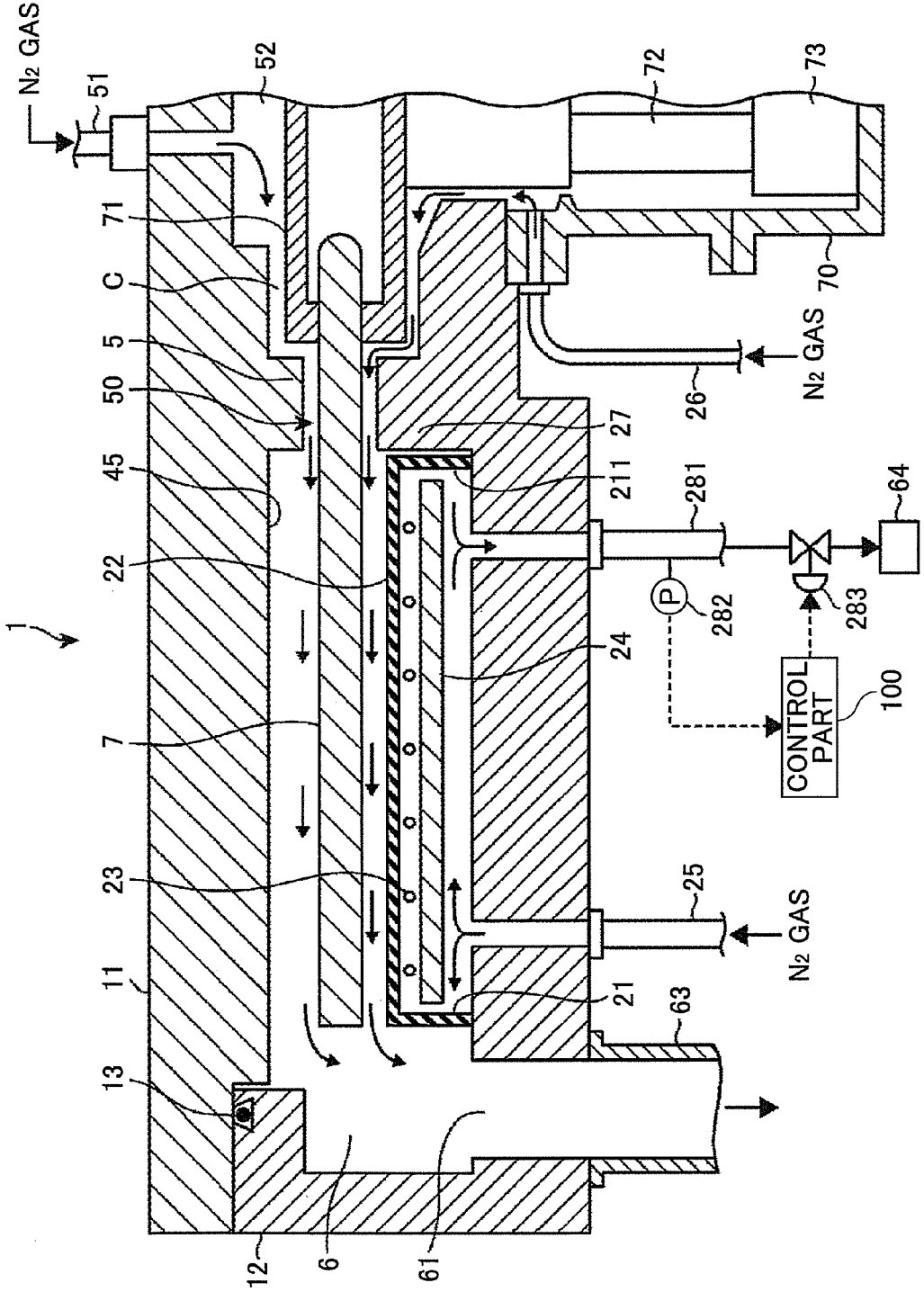
FIG. 15 is a cross-sectional view illustrating yet another structure of the bottom part of the film deposition apparatus.

The separation gas nozzle 41 (42) is located in the groove portion 43 formed in the convex portion 4 and the lower ceiling surfaces 44 are located in both sides of the separation gas nozzle 41 (42) in the above embodiment. However, as shown in FIG. 14, a conduit 47 extending along the radial direction of the turntable 7 may be made inside the convex portion 4, instead of the separation gas nozzle 41 (42), and plural holes 40 may be formed along the longitudinal direction of the conduit 47 so that the separation gas (N$_2$ gas) may be ejected from the plural holes 40 in other embodiments.

Figure 18A:
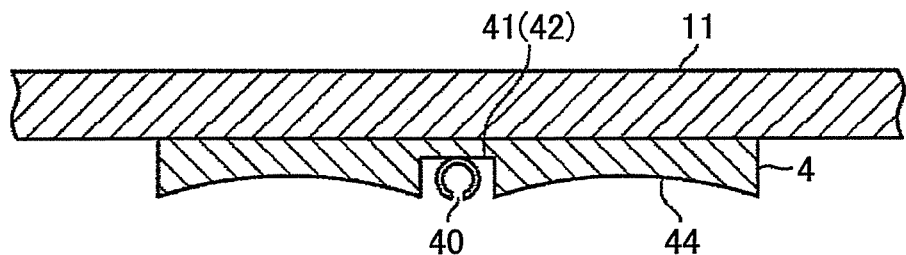
FIGS. 18A through 18C are vertical cross-sectional views illustrating other examples of the convex portion used for the separation area.
Figure 18B:
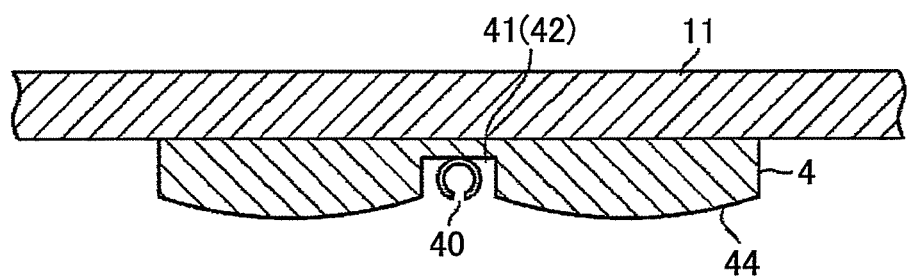
Figure 18C:
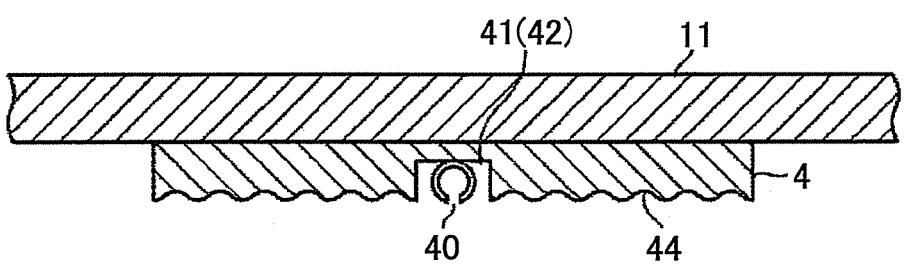

The ceiling surface 44 of the separation area D is not necessarily flat in other embodiments. For example, the ceiling surface 44 may be concavely curved as shown in FIG. 18A, convexly curved as shown in FIG. 18B, or corrugated as shown in FIG. 18C.

In addition, the convex portion 4 may be hollow and the separation gas may be introduced into the hollow convex portion 4. In this case, the plural gas ejection holes 40 may be arranged as shown in FIGS. 19A, 19B, 19C.

Figure 19A:
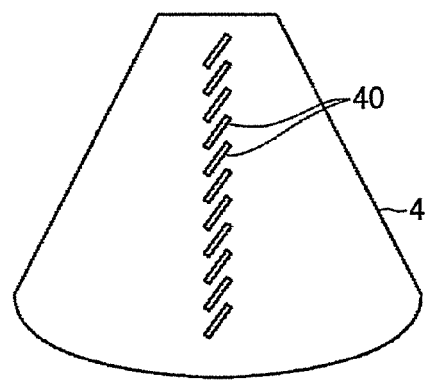
FIGS. 19A through 19C are plan views illustrating other examples of a gas discharge hole of a separation gas supply portion.
Figure 19B:
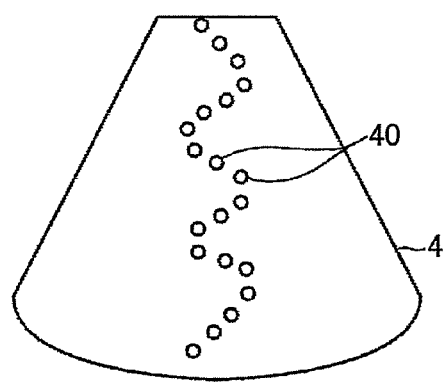
Figure 19C:
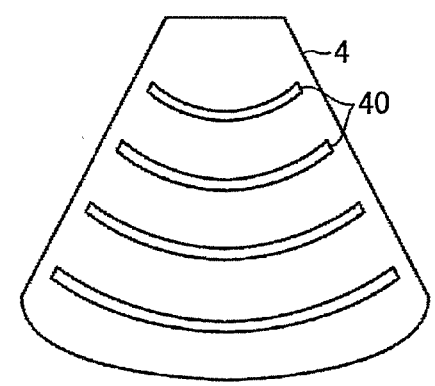

Referring to FIG. 19A, the plural gas ejection holes 40 each have a shape of a slanted slit. These slanted slits (gas ejection holes 33) are arranged to be partially overlapped with an adjacent slit along the radial direction of the turntable 7. In FIG. 19B, the plural gas ejection holes 40 are circular. These circular holes (gas ejection holes 40) are arranged along a serpentine line that extends in the radial direction as a whole. In FIG. 19C, each of the plural gas ejection holes 33 has the shape of an arc-shaped slit. These arc-shaped slits (gas ejection holes 40) are arranged at predetermined intervals in the radial direction.

Figure 20A:
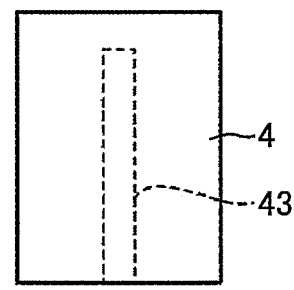
FIGS. 20A through 20D are plan views illustrating variations of the convex portion.
Figure 20B:
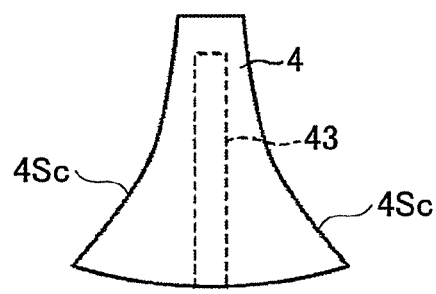
Figure 20C:
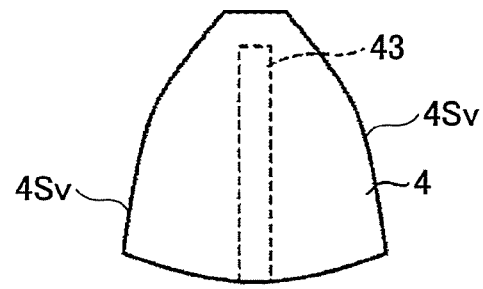
Figure 20D:
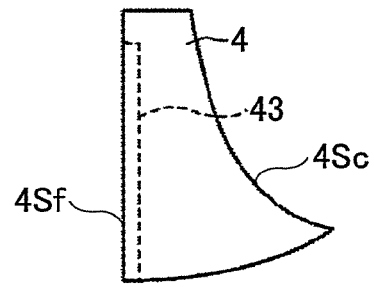

While the convex portion 4 has the sector-shaped top view shape in this embodiment, the convex portion 4 may have a rectangle top view shape as shown in FIG. 20A, or a square top view shape in other embodiments. Alternatively, the convex portion 4 may be sector-shaped as a whole in the top view and have concavely curved side surfaces 4Sc, as shown in FIG. 20B. In addition, the convex portion 4 may be sector-shaped as a whole in the top view and have convexly curved side surfaces 4Sv, as shown in FIG. 20C. Moreover, an upstream portion of the convex portion 4 relative to the rotation direction of the turntable 7 (FIG. 1) may have a concavely curved side surface 4Sc and a downstream portion of the convex portion 4 relative to the rotation direction of the turntable 7 (FIG. 1) may have a flat side surface 4Sf, as shown in FIG. 20D. Incidentally, dotted lines in FIGS. 20A through 20D represent the groove portions 43. In these cases, the separation gas nozzle 41 (42), which is housed in the groove portion 43, extends from the center portion of the chamber 1, for example, from the protrusion portion 5.

Figure 21:
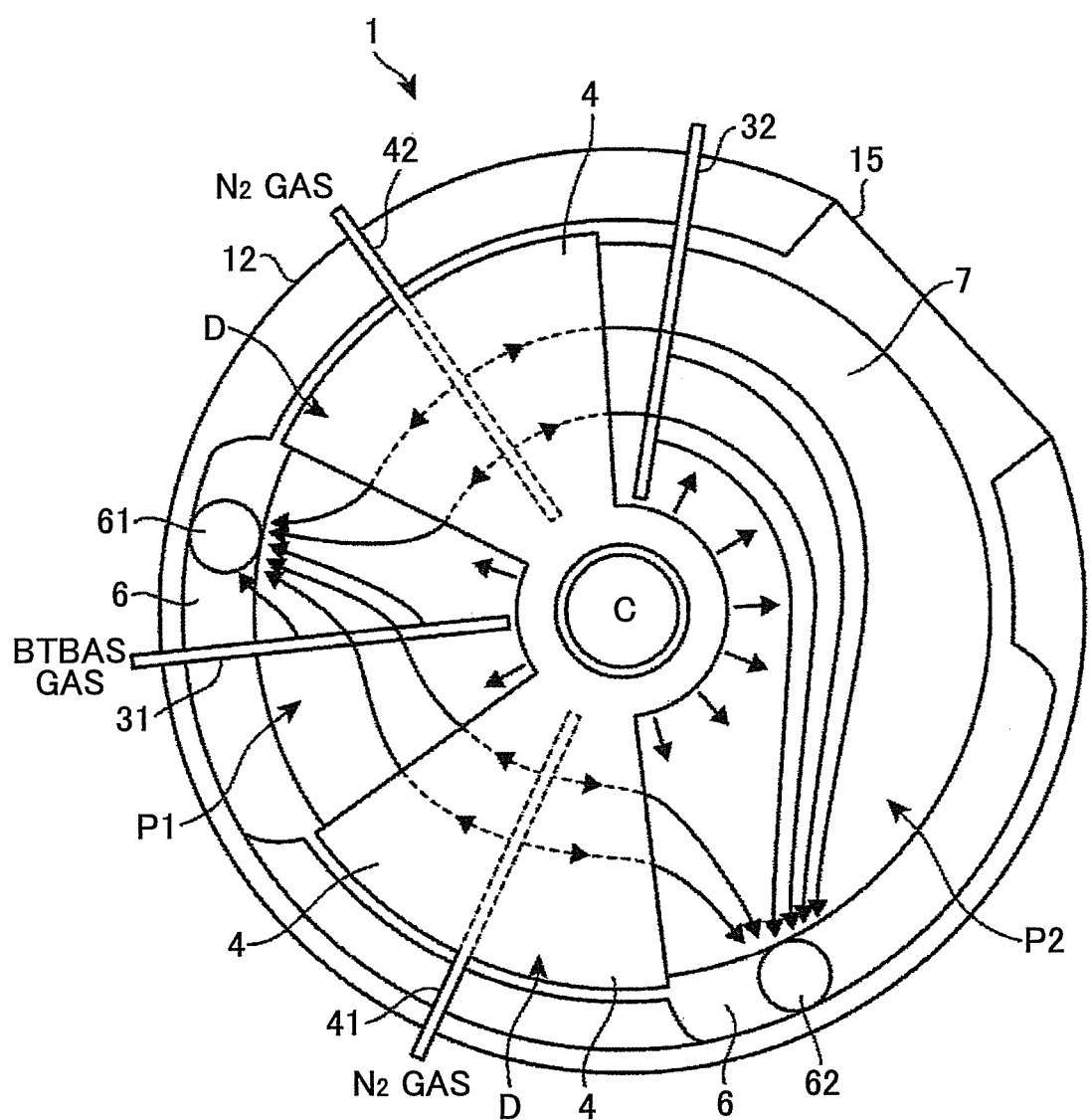
FIG. 21 is a horizontally cut-away plan view of the film deposition apparatus according to another example of the separation area.

The process areas P1, 22 and the separation area D may be arranged in other embodiments, as shown in FIG. 21. Referring to FIG. 21, the second reaction gas nozzle 32 for supplying the second reaction gas (e.g., O$_3$ gas) is located upstream of the rotation direction relative to the transfer opening 15, or between the separation gas nozzle 42 and the transfer opening 15. Even in such an arrangement, the gases ejected from the nozzle 31, 32, 41, 42 and the center area C flow generally along arrows shown in FIG. 21, so that the first reaction gas and the second reaction gas cannot be mixed. Therefore, a proper ALD (or MLD) mode film deposition can be realized by such an arrangement.

Figure 22:
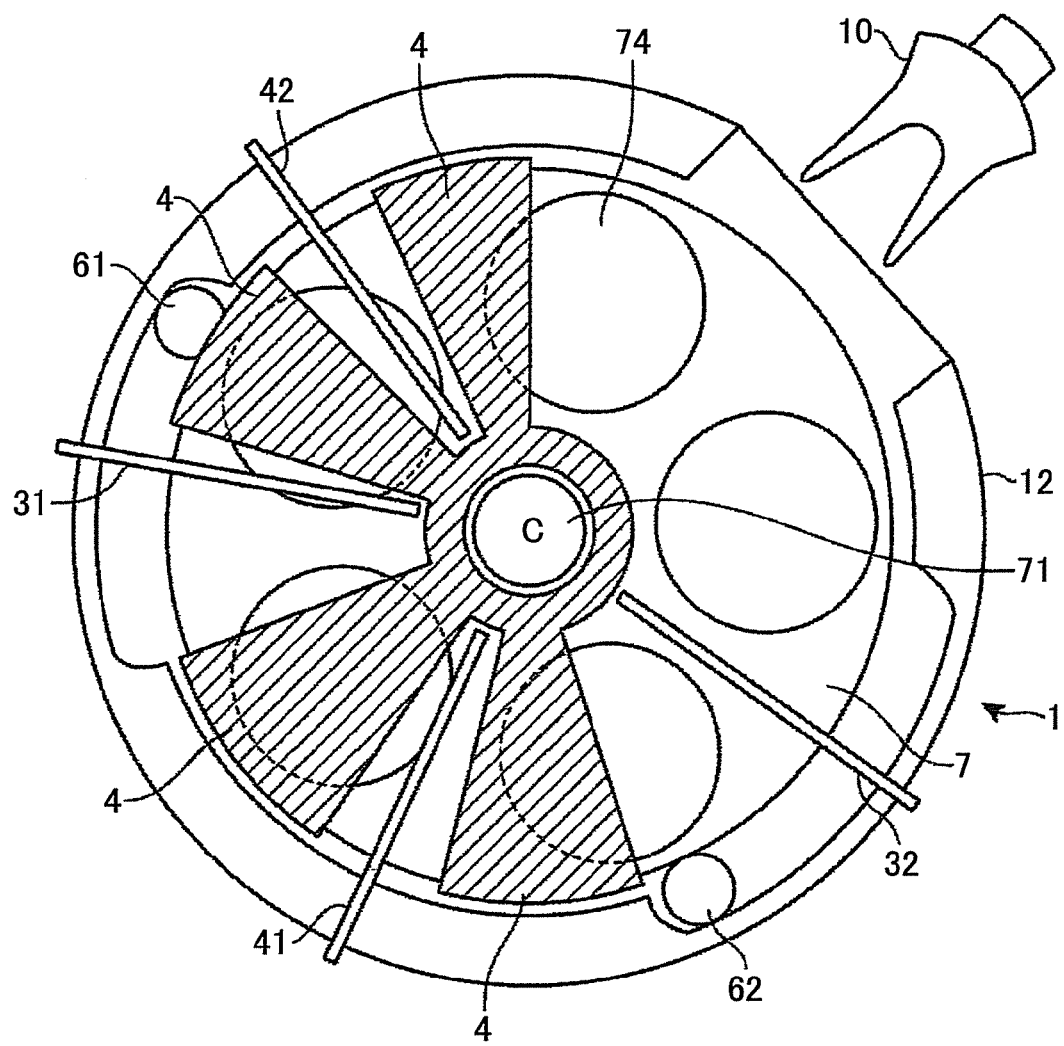
FIG. 22 is a horizontally cut-away plan view illustrating the film deposition apparatus according to a further example of the separation area.

In addition, the separation area D may be configured by attaching two sector-shaped plates on the bottom surface of the ceiling plate 1 by screws so that the two sector-shaped plates are located on both sides of the separation gas nozzle 41 (42), as stated above. FIG. 22 is a plan view of such a configuration. In this case, the distance between the convex portion 4 and the separation gas nozzle 41 (42), and the size of the convex portion 4 can be determined taking into consideration ejection rates of the separation gas and the reaction gas in order to effectively demonstrate the separation function of the separation area D.

Figure 23:
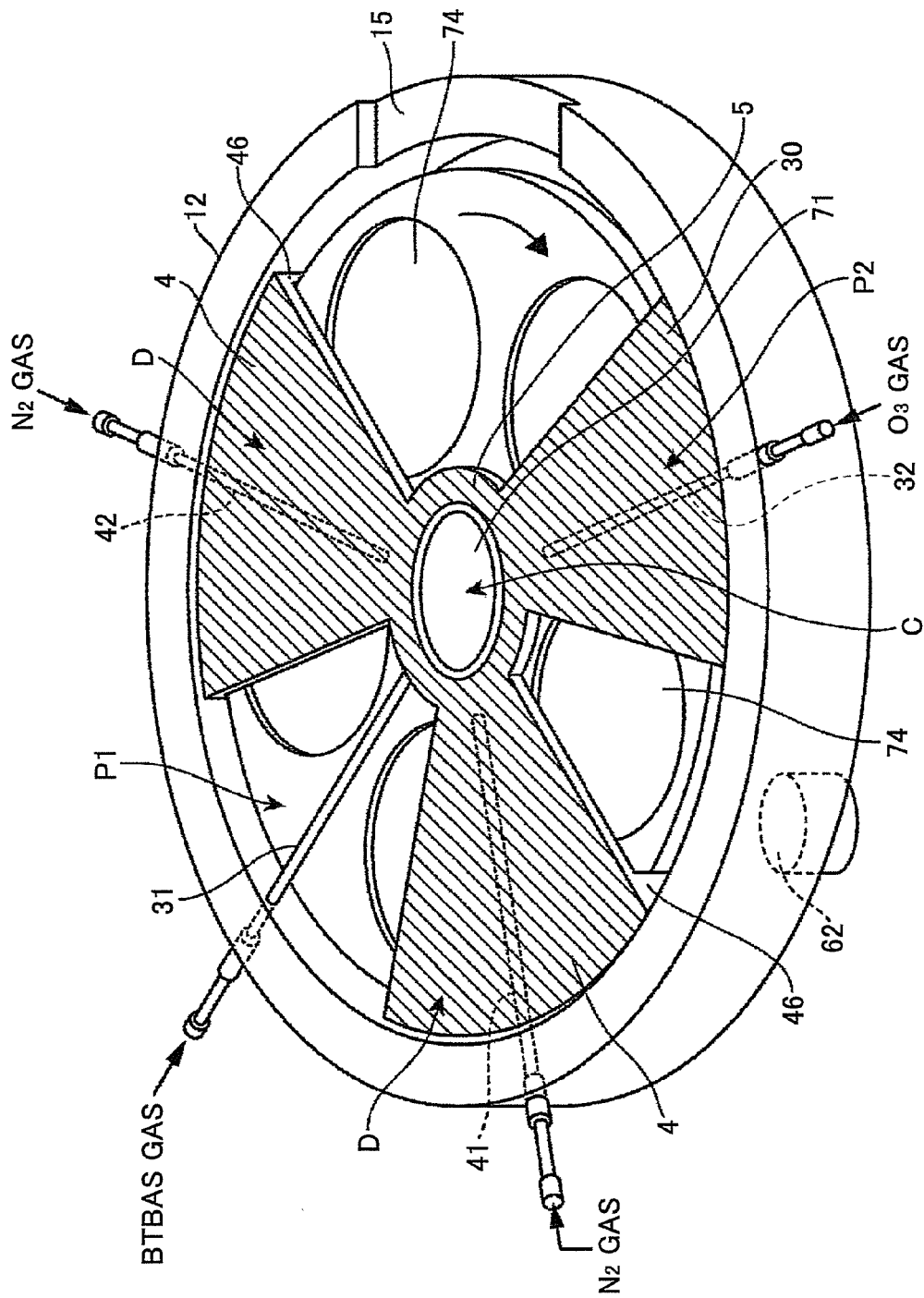
FIG. 23 is a perspective view illustrating an interior of the film deposition apparatus according to yet another example of the separation area.

In the above embodiment, the first process area P1 and the second process area P2 correspond to the areas having the ceiling surface 45 higher than the ceiling surface 44 of the separation area D. However, at least one of the first process area 21 and the second process area P2 may have another ceiling surface that opposes the turntable 7 in both sides of the reaction gas supplying nozzle 31 (32) and is lower than the ceiling surface 45 in order to prevent gas from flowing into a gap between the ceiling surface concerned and the turntable 7. This ceiling surface, which is lower than the ceiling surface 45, may be as low as the ceiling surface 44 of the separation area D. FIG. 23 shows an example of such a configuration. As shown, a sector-shaped convex portion 30 is located in the second process area 22, where the $O_3$ gas is adsorbed on the wafer W, and the reaction gas nozzle 32 is located in the groove portion (not shown) formed in the convex portion 30. In other words, this second process area P2 shown in FIG. 19 is configured in the same manner as the separation area D, while the gas nozzle is used in order to supply the reaction gas. In addition, the convex portion 30 may be configured as a hollow convex portion, an example of which is illustrated in FIGS. 19A through 19C.

Figure 24:
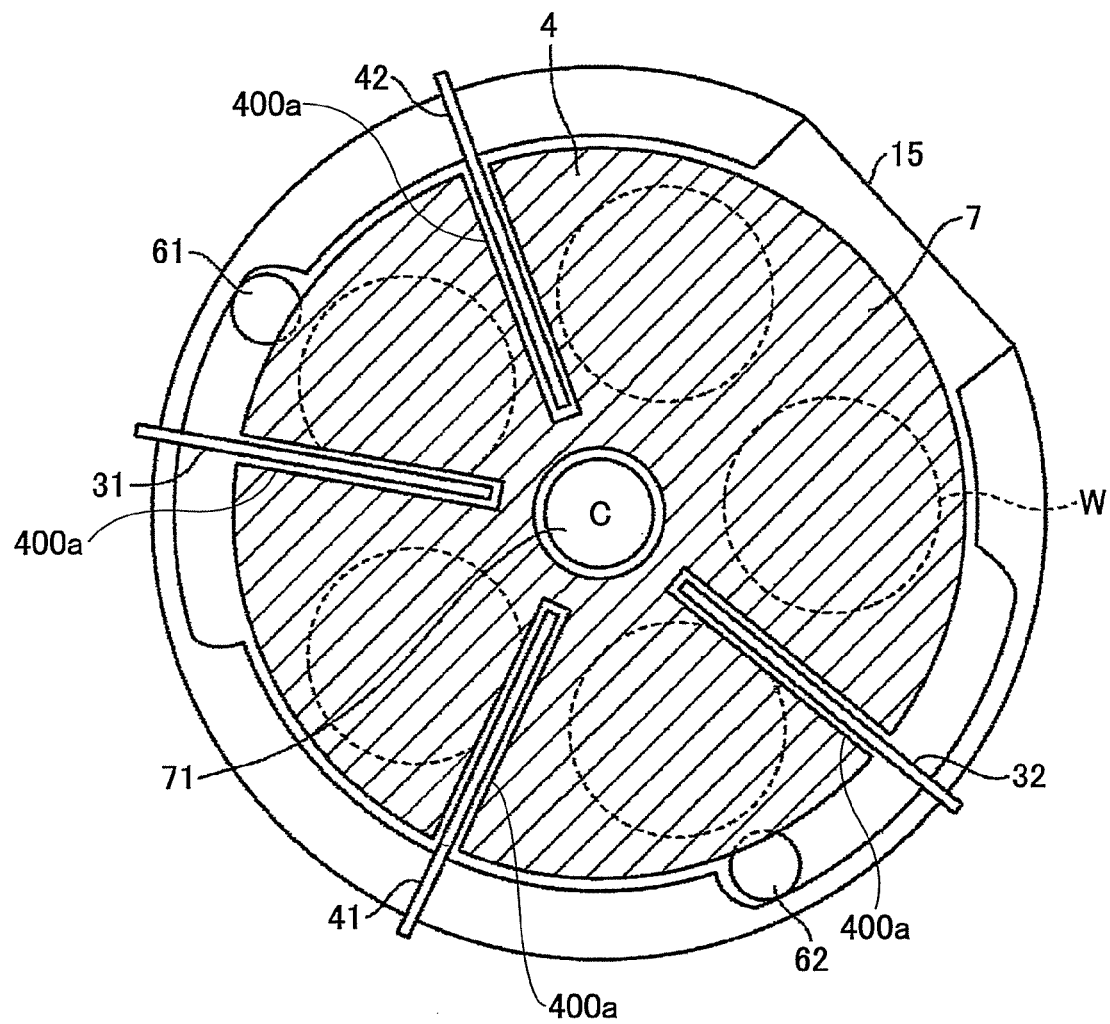
FIG. 24 is a horizontally cut-away plan view of the film deposition apparatus according to another example of the separation area.

Moreover, the ceiling surface, which is lower than the ceiling surface 45 and as low as the ceiling surface 44 of the separation area D, may be provided for both reaction gas nozzles 31, 32 and extended to reach the ceiling surfaces 44 in other embodiments as long as the low ceiling surfaces 44 are provided on both sides of the reaction gas nozzle 41 (42). In other words, as illustrated in FIG. 24, another convex portion 400 may be attached on the bottom surface of the ceiling plate 11 instead of the convex portion 4. The convex portion 400 has a shape of substantially circular plate, opposes substantially the entire top surface of the turntable 7, has four slots 400a where the corresponding gas nozzles 31, 32, 41, 42 are housed, the slots 400a extending in a radial direction, and leaves a thin space below the convex portion 400 in relation to the turntable 7. A height of the thin space may be comparable with the height h stated above. When the convex portion 400 is employed, the reaction gas ejected from the reaction gas nozzle 31 (32) diffuses to both sides of the reaction gas nozzle 31 (32) below the convex portion 400 (or in the thin space) and the separation gas ejected from the separation gas nozzle 41 (42) diffuses to both sides of the separation gas nozzle 41 (42). The reaction gas and the separation gas flow into each other in the thin space and are evacuated through the evacuation port 61 (62). Even in this case, the reaction gas ejected from the reaction gas nozzle 31 cannot be mixed with the other reaction gas ejected from the reaction gas nozzle 32, thereby realizing a proper ALD (or MLD) mode film deposition.

Incidentally, the convex portion 400 may be configured by combining the hollow convex portions 4 shown in any of FIGS. 19A through 19C in order to eject the reaction gases and the separation gases from the corresponding ejection holes 33 in the corresponding hollow convex portions 4 without using the gas nozzles 31, 32, 41, 42 and the slits 400a.

Figure 25:
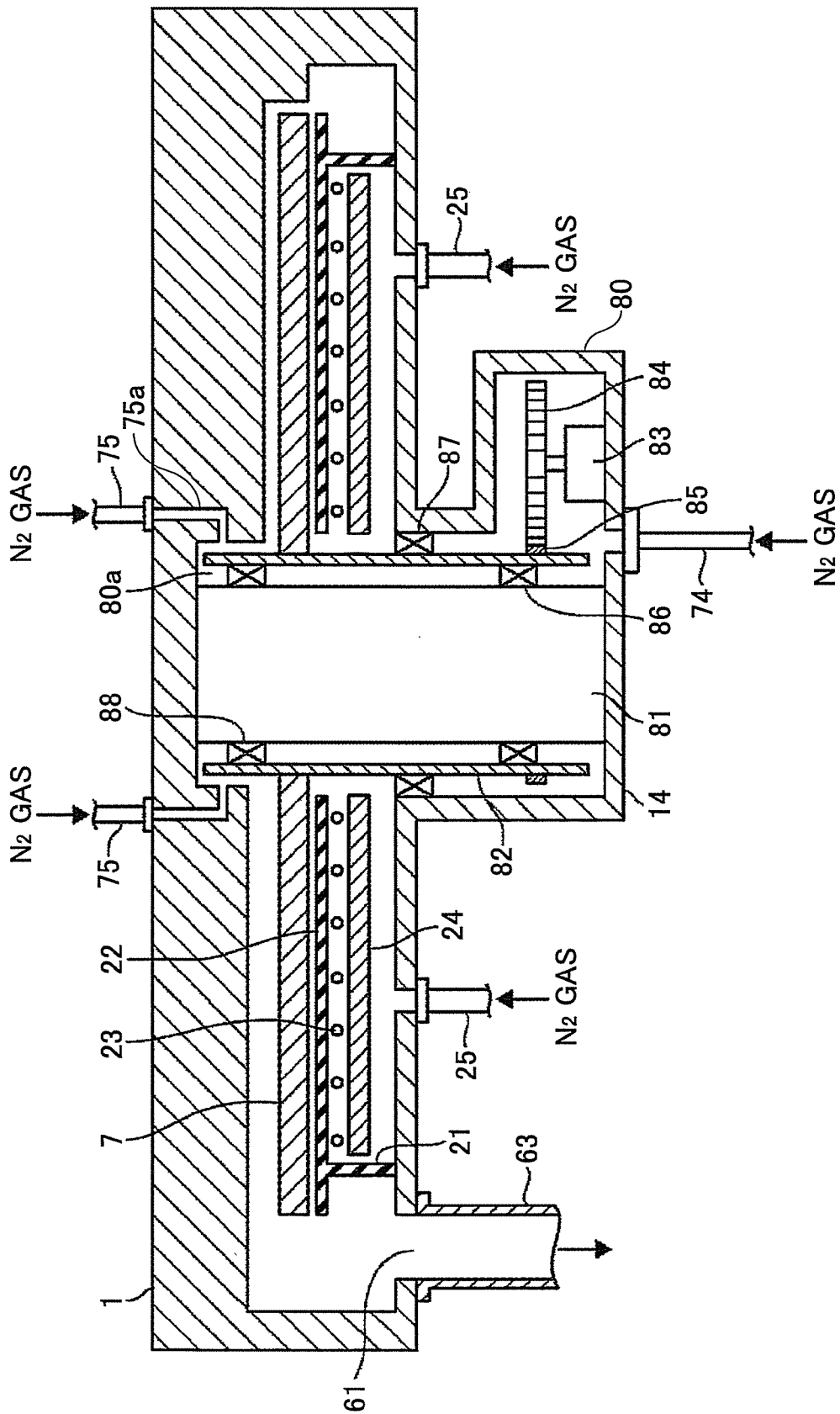
FIG. 25 is a vertical cross-sectional view of a film deposition apparatus according to another embodiment.

In the above embodiments, the rotation shaft 72 for rotating the turntable 7 is located in the center portion of the chamber 1. In addition, the space 52 between the core portion 71 and the ceiling plate 11 is purged with the separation gas in order to prevent the reaction gases from being mixed through the center portion. However, the chamber 1 may be configured as shown in FIG. 25 in other embodiments. Referring to FIG. 25, the bottom portion 14 of the chamber body 12 has a center opening to which a housing case 80 is hermetically attached. Additionally, the ceiling plate 11 has a center concave portion 80a. A pillar 81 is placed on the bottom surface of the housing case 80, and a top end portion of the pillar 81 reaches a bottom surface of the center concave portion 80a. The pillar 81 can prevent the first reaction gas (BTBAS) ejected from the first reaction gas nozzle 31 and the second reaction gas ($O_3$) ejected from the second reaction gas nozzle 32 from being mixed through the center portion of the chamber 1.

In addition, a rotation sleeve 82 is provided so that the rotation sleeve 82 coaxially surrounds the pillar 81. The rotation sleeve 82 is supported by bearings 86, 88 attached on an outer surface of the pillar 81 and a bearing 87 attached on an inner side wall of the housing case 80. Moreover, the rotation sleeve 82 has a gear portion 85 formed or attached on an outer surface of the rotation sleeve 82. Furthermore, an inner circumference of the ring-shaped turntable 7 is attached on the outer surface of the rotation sleeve 82. A driving portion 83 is housed in the housing case 80 and has a gear 84 attached to a shaft extending from the driving portion 83. The gear 84 is meshed with the gear portion 85. With such a configuration, the rotation sleeve 82 and thus the turntable 7 are rotated by a driving portion 83.

A purge gas supplying pipe 74 is connected to an opening formed in a bottom of the housing case 80, so that a purge gas is supplied into the housing case 80. With this, an inner space of the housing case 80 may be kept at a higher pressure than an inner space of the chamber 1, in order to prevent the reaction gases from flowing into the housing case 80. Therefore, no film deposition takes place in the housing case 80, thereby reducing maintenance frequencies. In addition, purge gas supplying pipes 75 are connected to corresponding conduits 75a that reach from an upper outer surface of the chamber 1 to an inner side wall of the concave portion 80a, so that a purge gas is supplied toward an upper end portion of the rotation sleeve 82. Because of the purge gas, the BTBAS gas and the $O_3$ gas cannot be mixed through a space between the outer surface of the rotation sleeve 82 and the side wall of the concave portion 80a. Although the two purge gas supplying pipes 75 are illustrated in FIG. 25, the number of the pipes 75 and the corresponding conduits 75a may be determined so that the purge gas from the pipes 75 can assuredly prevent gas mixture of the BTBAS gas and the $O_3$ gas in and around the space between the outer surface of the rotation sleeve 82 and the side wall of the concave portion 80a.

In the embodiment illustrated in FIG. 25, a space between the side wall of the concave portion 80a and the upper end portion of the rotation sleeve 82 corresponds to the ejection hole for ejecting the separation gas. In addition, the center area is configured with the ejection hole, the rotation sleeve 82, and the pillar 81.

Although the two kinds of reaction gases are used in the film deposition apparatus according to the above embodiment, three or more kinds of reaction gases may be used in other film deposition apparatuses according to other embodiments of the present invention. In this case, a first reaction gas nozzle, a separation gas nozzle, a second reaction gas nozzle, a separation gas nozzle, and a third reaction gas nozzle may be located in this order at predetermined angular intervals, each nozzle extending along the radial direction of the turntable 7. Additionally, the separation areas D including the corresponding separation gas nozzles are configured in the same manner as explained above.

Figure 26:
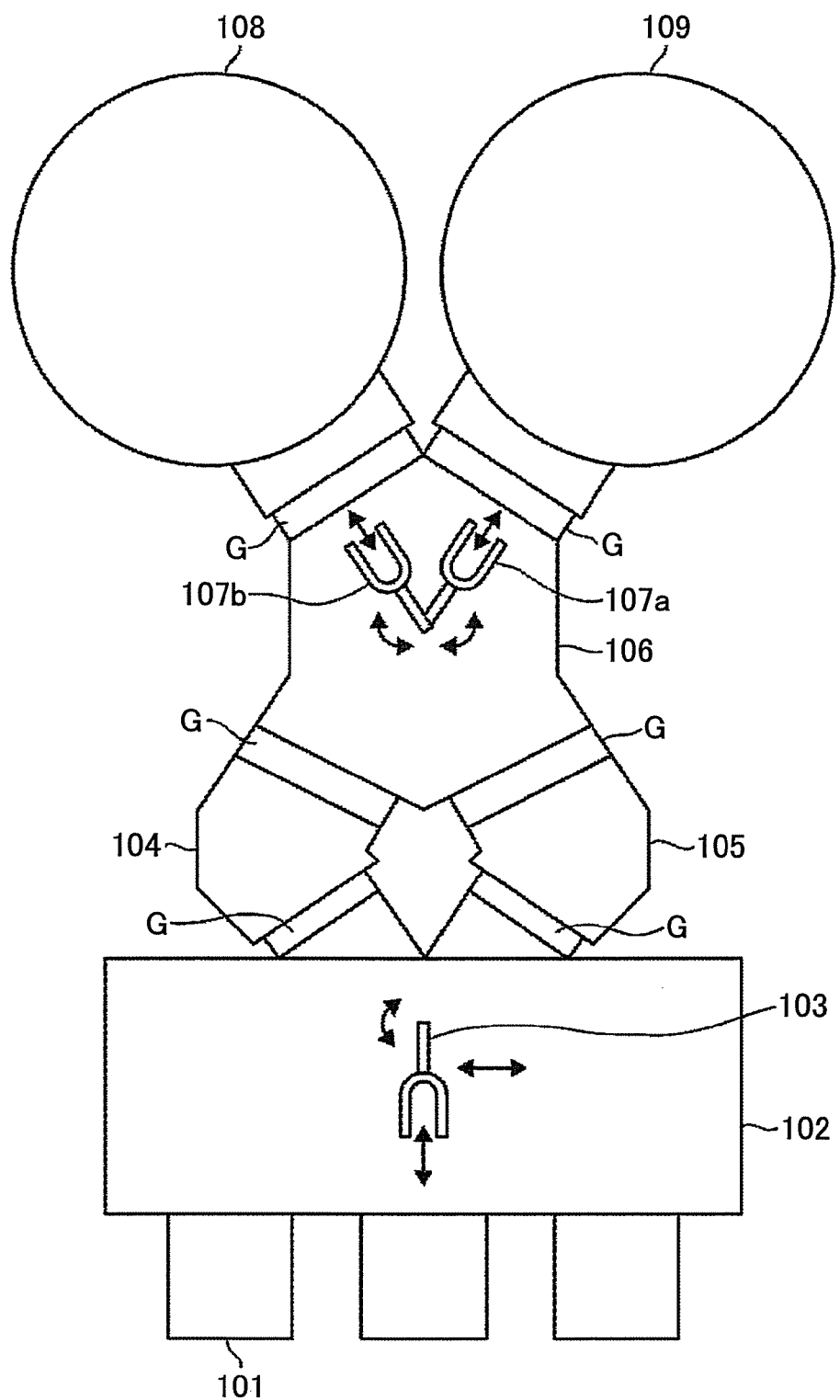
FIG. 26 is a schematic plan view illustrating an example of a substrate processing system using the film deposition apparatus according to the present invention.

The film deposition apparatus according to embodiments of the present invention may be integrated into a wafer process apparatus, an example of which is schematically illustrated in FIG. 26. The wafer process apparatus includes an atmospheric transfer chamber 102 in which a transfer arm 103 is provided, a load lock chamber (preliminary vacuum chamber) 105 whose atmosphere is changeable between vacuum and atmospheric pressure, a vacuum transfer chamber 106 in which two transfer arms 107a, 107b are provided, and film deposition apparatuses 108, 109 according to embodiments of the present invention. In addition, the wafer process apparatus includes cassette stages (not shown) on which a wafer cassette 101 such as a Front Opening Unified Pod (FOUP) is placed. The wafer cassette 101 is brought onto one of the cassette stages, and connected to a transfer in/out port provided between the cassette stage and the atmospheric transfer chamber 102. Then, a lid of the wafer cassette (FOUP) 101 is opened by an opening/closing mechanism (not shown) and the wafer is taken out from the wafer cassette 101 by the transfer arm 103. Next, the wafer is transferred to the load lock chamber 104 (105). After the load lock chamber 104 (105) is evacuated, the wafer in the load lock chamber 104 (105) is transferred further to one of the film deposition apparatuses 108, 109 through the vacuum transfer chamber 106 by the transfer arm 107a (107b). In the film deposition apparatus 108 (109), a film is deposited on the wafer in such a manner as described above. Because the wafer process apparatus has two film deposition apparatuses 108, 109 that can house five wafers at a time, the ALD (or MLD) mode deposition can be performed at high throughput.

The present invention is not limited to the specifically disclosed embodiments, and variations and modifications may be made without departing from the scope of the present invention.

What is claimed is:

1. A film deposition apparatus for depositing a film on a substrate by carrying out a cycle of alternately supplying at least two kinds of reaction gases that react with each other to the substrate to produce a layer of a reaction product in a vacuum chamber, the film deposition apparatus comprising:
    a turntable rotatably provided in said vacuum chamber;
    a rotation shaft extending downward from said turntable at a center of rotation;
    a cylindrical member provided around said rotation shaft;
    a substrate placement part provided at one surface of said turntable and configured to place said substrate thereon;
    a first reaction gas supplying portion configured to supply a first reaction gas to said one surface to form a first process area;
    a second reaction gas supplying portion configured to supply a second reaction gas to said one surface to form a second process area, the second reaction gas supplying portion being separated from said first reaction gas supplying portion along a rotation direction of said turntable;
    separation areas located along the rotation direction between said first process area and said second process area, the separation areas respectively separating said first process area and said second process area from each other;
    a heater provided at a lower side of said turntable with a space from the turntable to heat said turntable by radiation heat;
    an outer sidewall member provided at a bottom part of said vacuum chamber along a circumferential edge of said turntable with a space from the turntable to surround said heater;
    a space forming member extending from said outer sidewall member to form a heater surrounding space, in which said heater is provided, with said outer sidewall member and said cylindrical member such that a first narrow space is provided between said space forming member and said turntable directly below said turntable near the circumferential edge of said turntable;
    a first purge gas supplying portion configured to supply a first purge gas to said heater surrounding space to be flown out from said first narrow space; and
    a second purge gas supplying portion configured to supply a second purge gas to an inner side of said cylindrical member where said rotation shaft is provided,
    wherein said cylindrical member is configured to separate the inner side of said cylindrical member from said heater surrounding space such that its top surface is located directly below the turntable to horizontally extend to provide a second narrow space that is horizontally located between said turntable and the horizontally extended top surface of said cylindrical member directly below said turntable so that said second purge gas passing through said second narrow space is flown out from said first narrow space with said first purge gas.

2. The film deposition apparatus as claimed in claim 1, wherein said space forming member extends to an inner side or an outer side of said outer sidewall member.

3. The film deposition apparatus as claimed in claim 2, wherein said space forming member is formed of a quartz and extends toward a center area of said turntable by covering a top surface of said heater.

4. The film deposition apparatus as claimed in claim 1, wherein said heater includes a carbon wire heater, which is formed by a string-like resistance heating element formed by braiding pure carbon fibers, and a quartz tube sealing the carbon wire heater, and a plurality of the heaters are arranged to draw a plurality of circles enlarging from the center of rotation of said turntable toward a circumferential side of said turntable.

5. The film deposition apparatus as claimed in claim 4, wherein a reflective board is provided under said carbon wire heater in order to reflect a radiation heat radiated downward from said carbon wire heater toward said turntable.

6. The film deposition apparatus as claimed in claim 1, further comprising:
    a separation gas supplying portion configured to supply a separation gas to each of said separation areas;
    a ceiling surface located on both sides of each of the separation areas in said rotation direction in order to form a third narrow space between said ceiling surface and said turntable so that the separation gas flows from said separation area to a process area side; and
    an evacuation port configured to evacuate the reaction gas together with the separation gas spreading to both sides of each of said separation areas.

7. The film deposition apparatus as claimed in claim 1, wherein said space forming member extends to an inner side of said outer sidewall member toward the cylindrical member above the heater and form a gap between an inner edge of said space forming member and said cylindrical member directly below the turntable and adjacent to the second narrow space, and
    wherein said first purge gas supplying portion is configured to supply the first purge gas into the heater surrounding space so that the first purge gas flows toward said first narrow space through said gap.

8. The film deposition apparatus as claimed in claim 1, wherein said space forming member is not provided above the heater.

9. The film deposition apparatus as claimed in claim 1, wherein said space forming member extends to an outer side of said outer sidewall member.

10. The film deposition apparatus as claimed in claim 8, wherein said space forming member extends to an outer side of said outer sidewall member.

11. The film deposition apparatus as claimed in claim 1, further comprising:

a core portion that is fixed on a top end of said rotation shaft and is fixed to the center portion of the bottom surface of said turntable, wherein said cylindrical member is provided around at least a lower part of said core portion, and wherein said core portion and said cylindrical member are configured such that a bent narrow space is formed by said cylindrical member and said core portion, said bent narrow space including a horizontally extending space and a vertically extending space that is connected to said second narrow space such that said second purge gas flowing from the inner side of said cylindrical member flows through said first horizontally extending space, said vertically extending space and said second narrow space in this order.

12. The film deposition apparatus as claimed in claim 1, wherein the heater is separated from the rotation shaft by the cylindrical member.

* * * * *